US010790240B2

(12) United States Patent
Wu et al.

(10) Patent No.: US 10,790,240 B2
(45) Date of Patent: Sep. 29, 2020

(54) METAL LINE DESIGN FOR HYBRID-BONDING APPLICATION

(71) Applicant: Taiwan Semiconductor Manufacturing Co., Ltd., Hsinchu (TW)

(72) Inventors: Kuo-Ming Wu, Zhubei (TW); Kuan-Liang Liu, Pingtung (TW); Pao-Tung Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/462,078

(22) Filed: Mar. 17, 2017

(65) Prior Publication Data

US 2018/0269161 A1    Sep. 20, 2018

(51) Int. Cl.
| | |
|---|---|
| *H01L 23/12* | (2006.01) |
| *H01L 23/52* | (2006.01) |
| *H01L 29/40* | (2006.01) |
| *H01L 23/00* | (2006.01) |
| *H01L 23/58* | (2006.01) |
| *H01L 25/065* | (2006.01) |

(52) U.S. Cl.
CPC .......... *H01L 23/562* (2013.01); *H01L 23/564* (2013.01); *H01L 23/585* (2013.01); *H01L 24/83* (2013.01); *H01L 25/0657* (2013.01); *H01L 2224/83895* (2013.01); *H01L 2225/06558* (2013.01); *H01L 2924/1203* (2013.01); *H01L 2924/1304* (2013.01); *H01L 2924/13091* (2013.01)

(58) Field of Classification Search
CPC . H01L 2224/83895; H01L 2225/06558; H01L 23/562; H01L 23/564; H01L 23/585; H01L 24/83; H01L 25/0657
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,691,733 B1 * | 6/2017 | Shen ...................... H01L 24/83 |

(Continued)

*Primary Examiner* — Meiya Li
(74) *Attorney, Agent, or Firm* — Birch, Stewart, Kolasch & Birch, LLP

(57) ABSTRACT

A hybrid-bonding structure and a method for forming a hybrid-bonding structure are provided. The hybrid-bonding structure includes a first semiconductor substrate, a first conductive line and a first dielectric dummy pattern. The first conductive line is formed over the first semiconductor substrate. A surface of the first conductive line is configured to hybrid-bond with a second conductive line over a second semiconductor substrate. The first dielectric dummy pattern is formed over the first semiconductor substrate and embedded in the first conductive line.

20 Claims, 20 Drawing Sheets

(56) References Cited

U.S. PATENT DOCUMENTS

| | | | |
|---|---|---|---|
| 2006/0001165 A1* | 1/2006 | Tokitoh | H01L 23/585 |
| | | | 257/758 |
| 2009/0008750 A1* | 1/2009 | Tokitoh | H01L 23/562 |
| | | | 257/629 |
| 2009/0127652 A1* | 5/2009 | Ding | H01L 21/76 |
| | | | 257/508 |
| 2015/0194455 A1* | 7/2015 | Ho | H01L 27/14634 |
| | | | 257/460 |

* cited by examiner

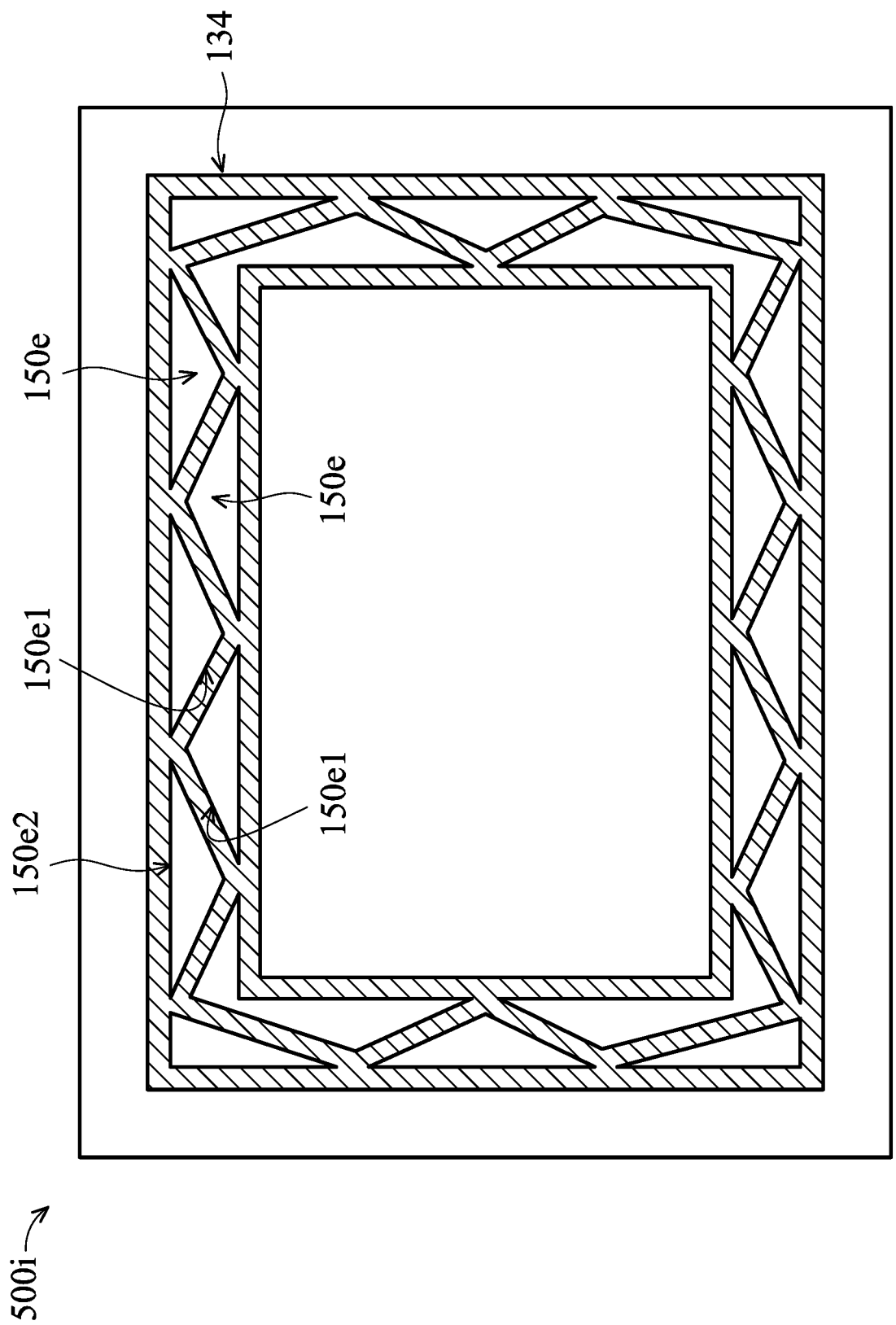

METAL LINE DESIGN FOR HYBRID-BONDING APPLICATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A-4M are plane views showing arrangements of dielectric dummy patterns embedded in the conductive line structure of a structure for forming a hybrid-bonding structure, in accordance with some embodiments.

DETAILED DESCRIPTION

Figure 1A:
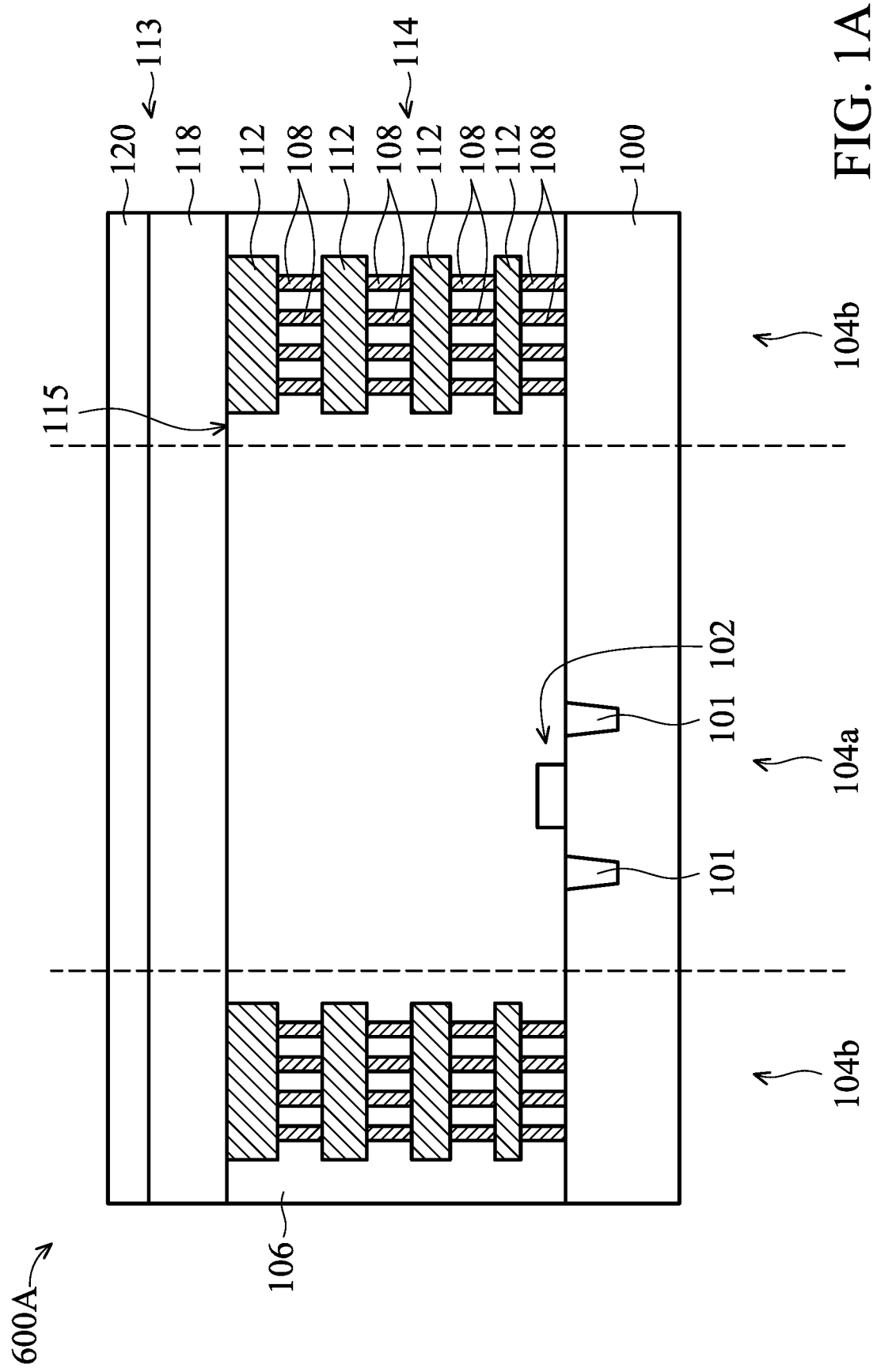
FIGS. 1A-1E are cross-sectional views of various stages of a process for forming a hybrid-bonding structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a hybrid-bonding structure and a method for forming the hybrid-bonding structure are provided. FIGS. 1A-1E are cross-sectional views of various stages of a process for forming a hybrid-bonding structure 600A, in accordance with some embodiments. As shown in FIG. 1A, a substrate 100 is received in accordance with some embodiments. The substrate 100 may be a semiconductor wafer such as a silicon wafer. In some embodiments, the substrate 100 includes elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. In some embodiments, the substrate 200 includes an epitaxial layer. For example, the substrate 200 has an epitaxial layer overlying a bulk semiconductor.

The substrate 100 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 100, in a P-well structure, in an N-well structure or in a dual-well structure.

In some embodiments, the substrate 100 includes a circuit region 104a and a seal ring region 104b surrounding the circuit region 104a. In some embodiments, the substrate 100 includes one or more integrated circuit structures 102 formed in the circuit region 104a of the substrate 100. The integrated circuit structure 102 may include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, and/or other applicable elements. Various processes are performed to form the integrated circuit structure 102, such as deposition, etching, implantation, photolithography, annealing, and/or other applicable processes. In some embodiments, the integrated circuit structure 102 is formed in the substrate 100 in a front-end-of-line (FEOL) process.

In some embodiments, the substrate 100 further include one or more isolation features 101 formed in the circuit region 104a, such as shallow trench isolation (STI) features or local oxidation of silicon (LOCOS) features. The isolation features 101 may surround the integrated circuit structure 102. The isolation features 101 are configured to provide physical and electrical isolation between the integrated circuit structure 102 and other integrated circuit structures (not shown).

In some embodiments, the substrate 100 includes a seal ring structure 114 formed in the seal ring region 104b. In some embodiments, the seal ring structure 114 is formed in a dielectric layers 106 (such as interlayer dielectric (ILD) or an inter-metal dielectric (IMD) layer). The dielectric layer 106 may include a single layer or multiple dielectric layers. In some embodiments, the dielectric layer 106 is made of silicon oxide, silicon oxynitride, un-doped silicate glass (USG), borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 106 is formed by a chemical vapor deposition (CVD) process, a spin-on process, a sputtering process, or a combination thereof.

In some embodiments, the dielectric layer 106 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the seal ring structure 114 includes conductive layers 112 and vias 108 formed in the dielectric layer 106. In some embodiments, the seal ring structure 114 is formed by repeatedly stacking the conductive layers 112 and the vias 108 on top of each other. The vias 108 are alternately arranged with the conductive layers 112. In some embodiments, the seal ring structure 114 is formed continuously surrounding the circuit region 104a. The seal ring structure 114 may serve as a barrier for preventing contaminants such as moisture, chemicals, corrosive material or etc. from penetrating into the substrate 100 and preventing cracks from propagating into the substrate 100 upon die-sawing operations. In some embodiments, the seal ring structure 114 is electrically isolated from the integrated circuit structure 102.

The conductive layers 112 and the vias 108 may be made of a conductive material, such as copper (Cu), aluminum (Al), tungsten (W), titanium (Ti), titanium nitride (TiN), tantalum (Ta), tantalum nitride (TaN), or another applicable material. In some embodiments, the conductive layers 112 and the vias 108 are copper or copper alloy. In some embodiments, the conductive layers 112 and the vias 108 are formed by single and/or dual damascene processes. The conductive layers 112 may include multiple metal layers (namely M1, M2, M3 . . . , and Mtop) which are interconnected through the vias 108. In some embodiments, another metal line and another via are formed over and electrically connected to the conductive layers 112 and the vias 108. The conductive layers 112 and the vias 108 of the seal ring structure 114 are formed in a back-end-of-line (BEOL) process.

After the seal ring structure 114 is formed, a dielectric layer 118 and a dielectric layer 120 are sequentially formed over a substrate 100, as shown in FIG. 1A in accordance with some embodiments. The dielectric layer 118 and the dielectric layer 120 are formed covering a top surface 115 of the seal ring structure 114. In some embodiments, the dielectric layer 118 and the dielectric layer 120 may collectively serve as a dielectric layer structure 113. In some embodiments, the dielectric layer 118 and the dielectric layer 120 are formed of insulating material such as oxide based materials including silicon oxide ($SiO_2$), silicon oxynitride (SiON), silicon oxycarbon nitride (SiOCN) or other insulting materials. In some embodiments, the dielectric layer 118 is formed of an insulating material that is different from the dielectric layer 120. In some embodiments, the dielectric layer 118 is formed of $SiO_2$, the dielectric layer 120 is formed of SiON or SiOCN. In some embodiments, the dielectric layer 118 and the dielectric layer 120 are formed by performing a plasma enhanced chemical vapor deposition (CVD) process, a low pressure CVD process, an atomic layer deposition (ALD) process, or another applicable process.

Figure 1B:
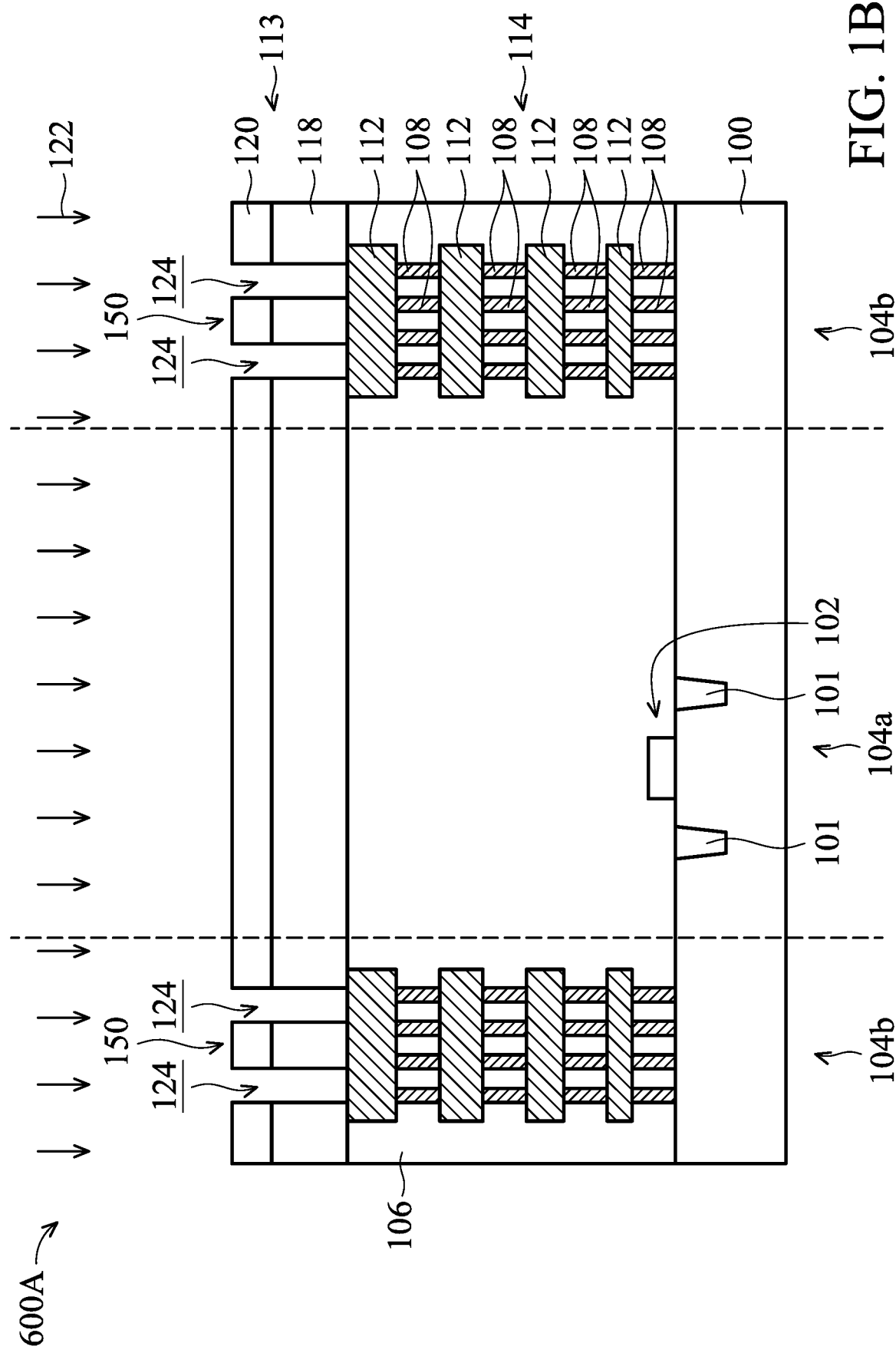

After the dielectric layer 118 and the dielectric layer 120 are formed, a patterning process 122 is performed to form dielectric dummy patterns 150 and openings 124 through the dielectric layer 118 and the dielectric layer 120, as shown in FIG. 1B in accordance with some embodiments. In some embodiments, positions of the openings 124 provide a position of a conductive line formed in the subsequent processes. The conductive line is configured to hybrid-bond with another conductive line of another semiconductor structure. The dielectric dummy patterns 150 and the openings 124 are formed directly over the topmost conductive layer 112 of the seal ring structure 114. In some embodiments, portions of the topmost conductive layer 112 (located at the topmost metal layer Mtop) of the seal ring structure 114 are exposed by the openings 124. The dielectric dummy patterns 150 are surrounded by the openings 124.

In some embodiments, the patterning process 122 includes a photolithography process and a subsequent etching process. In some embodiments, the etching process is a dry etching process. In some embodiments, etching gases used in the etching process include fluorine-containing (F-containing) gases. During the etching process, portions of the dielectric layer structure 113 is removed through an opening of an etching mask (not shown) formed by the photolithography process, and the etching process stops when the topmost conductive layer 112 of the seal ring structure 114 is exposed.

After the dielectric dummy patterns 150 and the openings 124 are formed, a seed layer 128 is conformally formed over the dielectric layer structure 113. The seed layer 128 is formed lining the openings 124 to assist the formation of a conductive material for forming a conductive line in the subsequent processes. In some embodiments, the seed layer 128 is made of copper-containing conductive materials. In some embodiments, the seed layer 128 is formed by a physical vapor deposition (PVD) process, an atomic layer deposition (ALD) process, or another applicable process. In some embodiments, the seed layer 128 has a thickness in a range from about 10 Å to about 500 Å

Figure 1C:
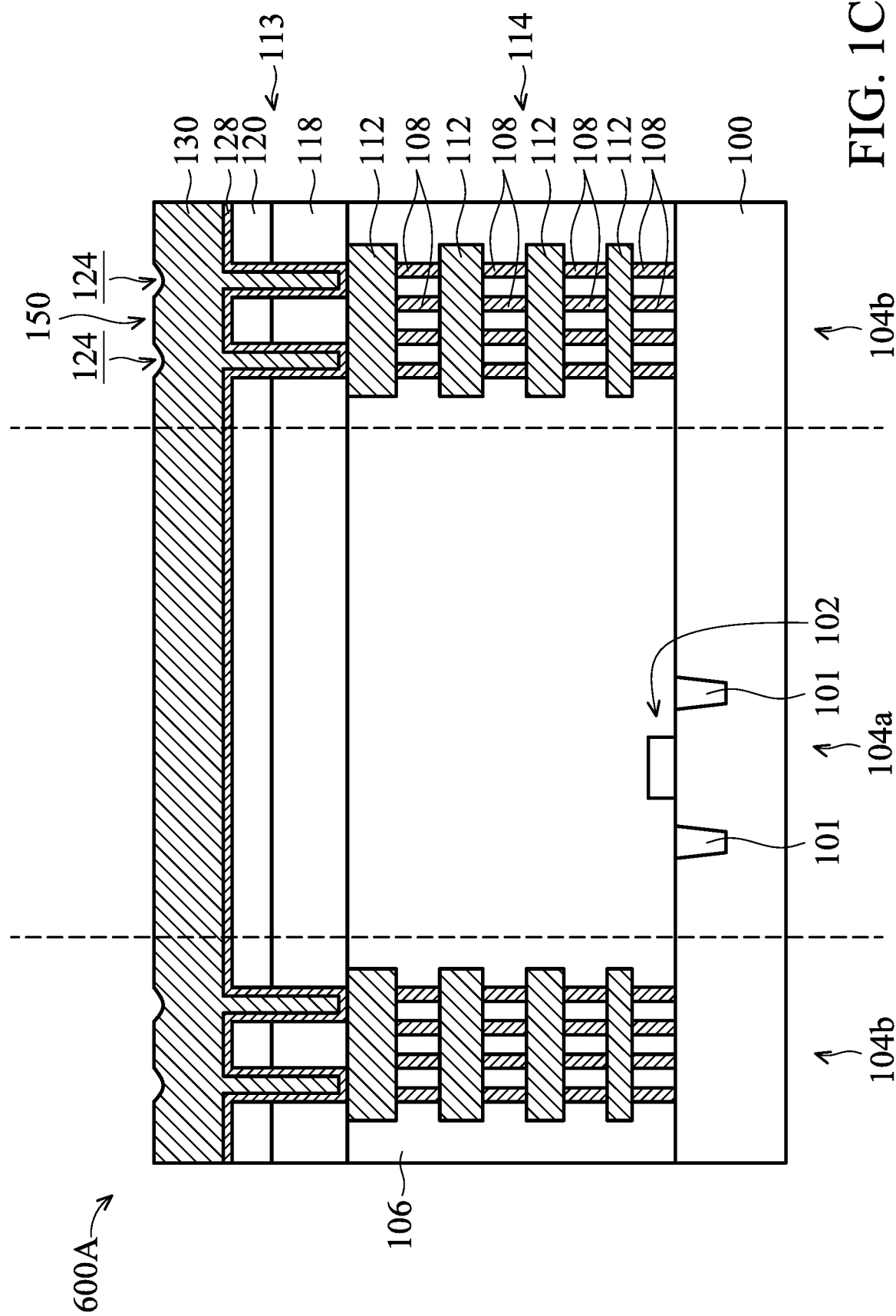

After the seed layer 128 is formed, a conductive material 130 is formed over the dielectric layer structure 113, as shown in FIG. 1C in accordance with some embodiments. The conductive material 130 is deposited to fill the openings 124. In some embodiments, the conductive material 130 is made of copper (Cu), aluminum (Al), aluminum copper (AlCu), cobalt (Co), tungsten (W), or another applicable material. In some embodiments, the conductive material 130 is made of copper (Cu) or copper alloy. In some embodiments, the conductive material 130 is formed by a physical vapor deposition (PVD) process, an atomic layer deposition (ALD) process, or another applicable process. In some embodiments, the conductive material 130 is formed by a plating method.

In some embodiments, a barrier layer (not shown) is deposited over the dielectric layer structure 113 to line openings 124 before forming the seed layer 128 and the conductive material 130. The barrier layer is configured to separate the conductive material 130 from the dielectric layer structure 113. In some embodiments, the barrier layer is made of titanium (Ti), titanium alloy, tantalum (Ta) or tantalum alloy. In some embodiments, the barrier layer is formed by a physical vapor deposition (PVD) process, an atomic layer deposition (ALD) process, or another applicable process. In some embodiments, the barrier layer has a thickness in a range from about 50 Å to about 1000 Å.

Figure 1D:
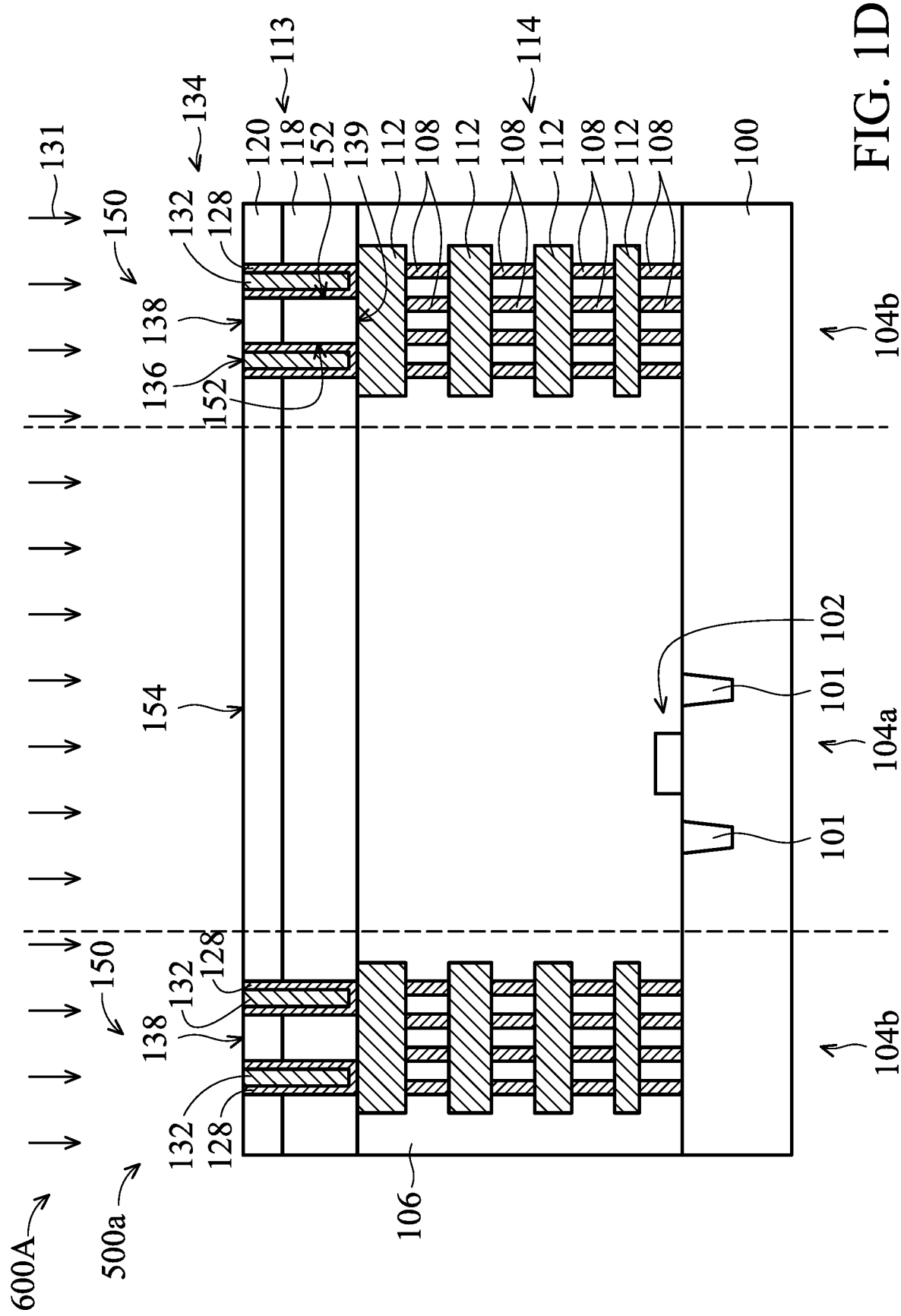
Figure 1E:
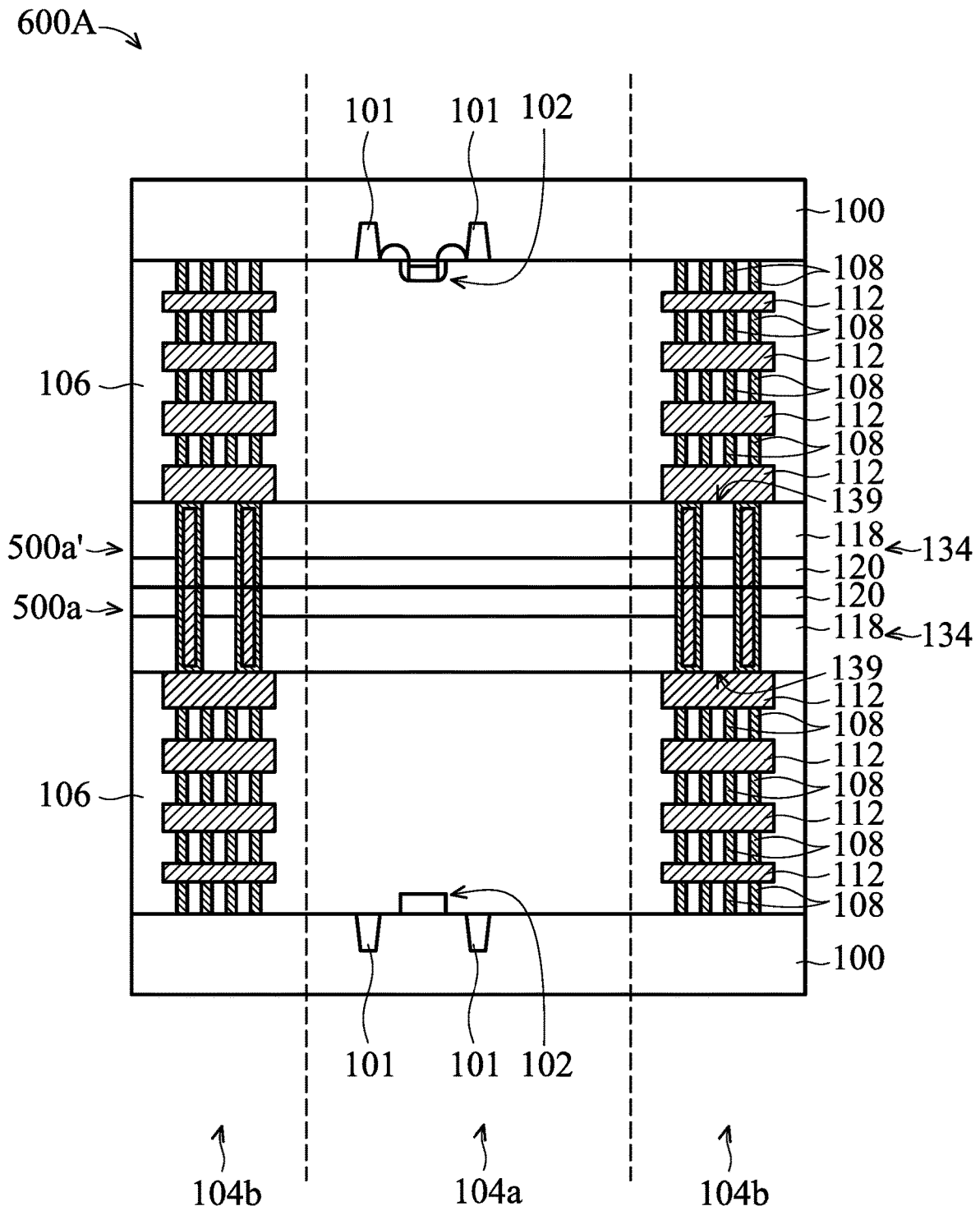

After the conductive material 130 is formed, a planarization process 131 is performed on the conductive material 130 and the seed layer 128 above the dielectric layer structure 113, as shown in FIG. 1D in accordance with some embodiments. The planarization process 131 is performed to remove the conductive material 130 and the seed layer 128 above the dielectric layer structure 113 and outside the openings 124. The planarization process 131 is performed until the dielectric layer structure 113 is exposed. In some embodiments, the planarization process 131 includes an etch-back process and/or a chemical mechanical polishing (CMP) process.

After performing the planarization process 131, a conductive line 132 is formed in the openings 124. In some embodiments, the seed layer 128 merges with the conductive line 132 to form a conductive line 134 in the openings 124.

Figure 3:
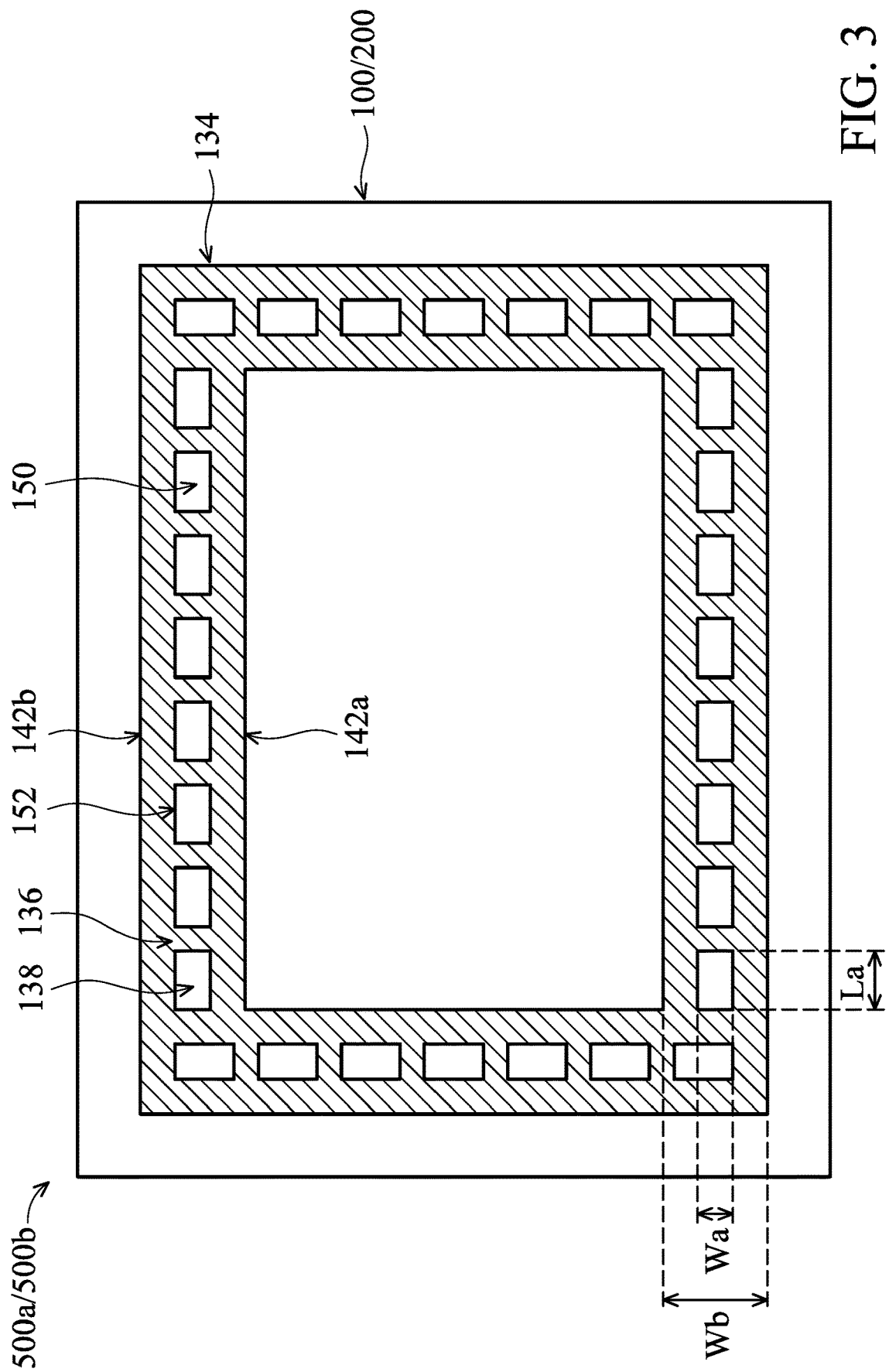
FIG. 3 is a plane view of a structure for forming a hybrid-bonding structure as shown in FIG. 1D and FIG. 2, in accordance with some embodiments.

After performing the aforementioned processes, a structure 500a of the hybrid-bonding structure 600A is formed, as shown in FIG. 1D in accordance with some embodiments. FIG. 3 is a plane view of the structure 500a of the hybrid-bonding structure 600A as shown in FIG. 1D, in accordance with some embodiments.

As shown in FIG. 1D, in some embodiments, the conductive line 132 (or the conductive line 134) is formed directly over the seal ring structure 114. The conductive line 132 is electrically connected to the topmost conductive layer 112 of the seal ring structure 114. In some embodiments, the conductive line 132 (or the conductive line 134) serves as a bonding layer of the seal ring structure 114 of the structure 500a.

As shown in FIG. 1D and FIG. 3, in some embodiments, the dielectric dummy patterns 150 are formed embedded in the conductive line 132 (or the conductive line 134). In some embodiments, top surfaces 138 of the dielectric dummy patterns 150 are aligned with a top surface 136 of the conductive line 132 (or the conductive line 134). In some embodiments, the top surfaces 138 of the dielectric dummy patterns 150 and the top surface 136 of the conductive line 134 may serve as a bonding surface 154 of the semiconductor structure 500a of the hybrid-bonding structure 600A. In some embodiments, the top surfaces 138 of the dielectric dummy patterns 150 and the top surface 136 of the conductive line 134 are exposed for hybrid-bonding with another conductive line of another semiconductor structure.

In some embodiments, the dielectric dummy patterns 150 are formed in the seal ring region 104b and directly over the seal ring structure 114. Sidewalls 152 and bottom surfaces 139 of the dielectric dummy patterns 150 are surrounded by the conductive line 134 and the topmost conductive layer 112 of the seal ring structure 114. In some embodiments, there is no semiconductor device element formed within the dielectric dummy patterns 150. In addition, there is no semiconductor device element formed between the dielectric dummy patterns 150 and the conductive line 134. Furthermore, there is no semiconductor device element formed between the dielectric dummy patterns 150 and the topmost conductive layer 112 of the seal ring structure 114.

In some embodiments, the dielectric dummy patterns 150 are formed over the seal ring structure 114 and surrounded by the conductive line 134 shown in FIG. 1D and FIG. 3. The dielectric dummy patterns 150 are formed between an inner boundary 142a and an outer boundary 142b of the conductive line 134. In some embodiments, the total area of the top surfaces 150 of the dielectric dummy patterns 150 is less than, equal to or greater than the area of the top surface 136 of the conductive line 134 in a plan view shown in FIG. 3.

In some embodiments, each of the dielectric dummy patterns 150 has a length La and a width Wa shown in FIG. 3. In some embodiments, the length La of each of the dielectric dummy patterns 150 is less than or equal to the total length of the conductive line 134. In some embodiments, the width Wa of each of the dielectric dummy patterns 150 is less than a width Wb of the conductive line 134.

In some embodiments, the dielectric dummy patterns 150 may have a circular-shape, an oval-shape, a polygonal-shape, or a ring-shape from a plane view. In some embodiments, the dielectric dummy patterns 150 are rectangular, as shown in FIG. 3. In some embodiments, the dielectric dummy patterns 150 are arranged substantially along an extending direction of the conductive line 134. In some embodiments, when the conductive line 134 is arranged as a ring (a rectangular ring), the dielectric dummy patterns 150 are collectively arranged as a dash-ring, as seen in the plan view shown in FIG. 3.

Afterwards, a structure 500a' similar to or the same as the structure 500a formed by the aforementioned processes shown in FIG. 1A to FIG. 1E are bonded to the structure 500a vertically to form the hybrid-bonding structure 600A by performing a hybrid-bonding process, as shown in FIG.

1E in accordance with some embodiments. The structure 500a' is flipped upside down to facilitate the conductive line 134 of the structure 500a' hybrid-bonded to the conductive line 134 of the structure 500a. The substrate 100 of the structure 500a' is separated from the substrate 100 of the structure 500a through the conductive line 134 of the structure 500a and the conductive line 134 of the structure 500a'. The conductive line 134 of the structure 500a is aligned with and in contact with the conductive line 134 of the structure 500a'. In some embodiments, the topmost conductive layer 112 of the seal ring structure 114 and the conductive line 134 of the structure 500a, and the topmost conductive layer 112 of the seal ring structure 114 and the conductive line 134 of the structure 500a' encapsulate the dielectric dummy patterns 150 of the structure 500a and the dielectric dummy patterns 150 of the structure 500a'. In some embodiments, the dielectric dummy patterns 150 of the structure 500a are in contact with the dielectric dummy patterns 150 and/or the conductive line 134 of the structure 500a'.

In some embodiments, the conductive line 134 of the structure 500a and the conductive line 134 of the structure 500a' for hybrid-bonding have the dielectric dummy patterns 150 embedded in the conductive line 134. The dielectric dummy patterns 150 can contribute to the bond strength between the conductive line 134 of the structure 500a' and the conductive line 134 of the structure 500a of the hybrid-bonding structure 600A. Because the dielectric dummy patterns 150 are embedded in the conductive line 134, the area of the top surface 136 of the conductive line 134 can be reduced to improve the CMP loading effect during the planarization process (such as the CMP process) while the conductive line 134 has a wide width Wb. Therefore, the top surfaces 138 of the dielectric dummy patterns 150 are easy to make coplanar with the top surface 136 of the conductive line 134, and the bonding surface 154 of the structure 500a has a planarized surface topography. As a result, the bonding wave propagation is improved during the hybrid-bonding process. The delamination problem and the conductive line opening problem that occurs between the bonding surface 154 of the structure 500a' and the bonding surface 154 of the structure 500a are avoided.

Figure 2:
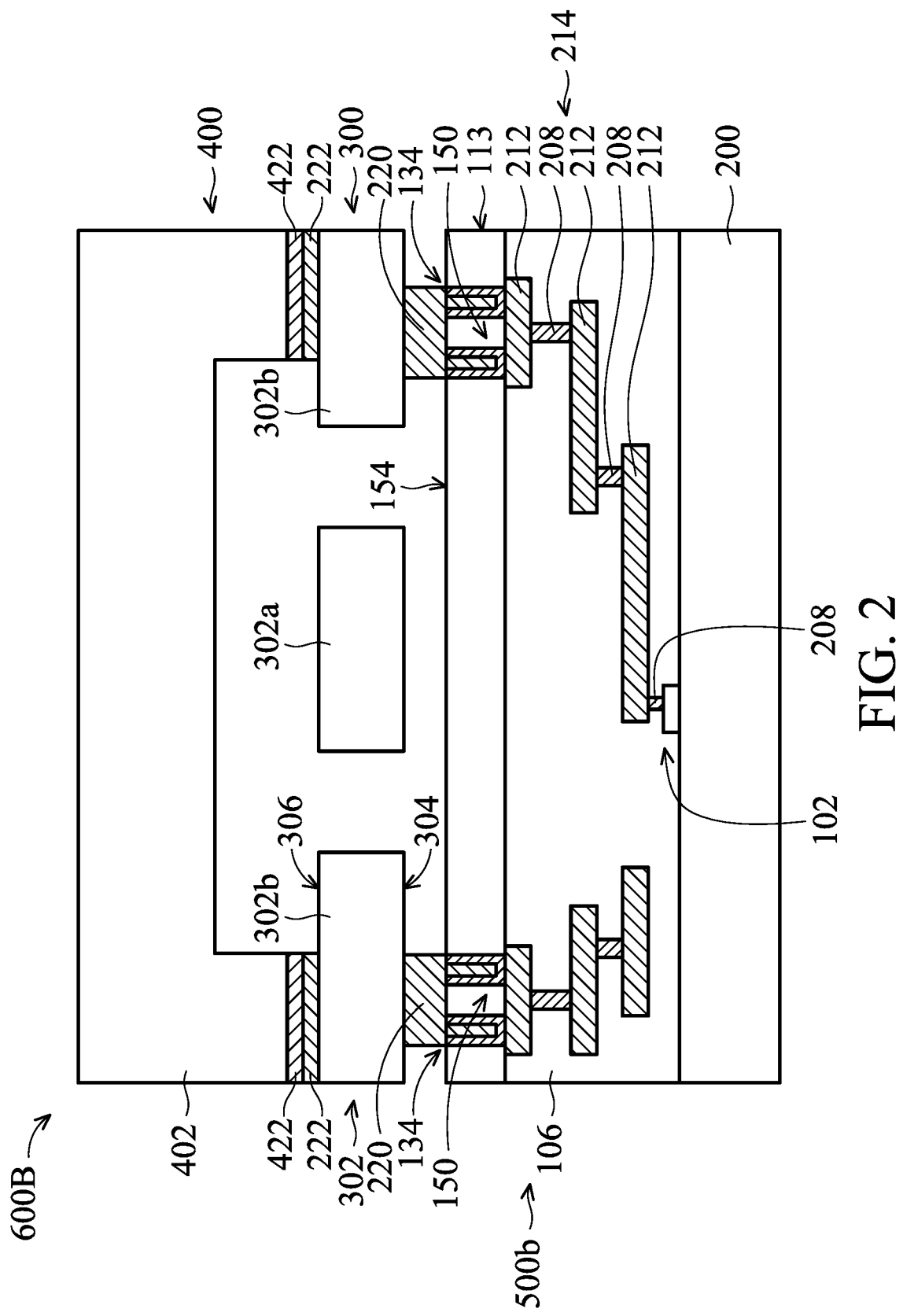
FIG. 2 is a cross-sectional view of a hybrid-bonding structure, in accordance with some embodiments.

FIG. 2 is a cross-sectional view of a hybrid-bonding structure 600B, in accordance with some embodiments. FIG. 3 is a plane view of the structure 500b of the hybrid-bonding structure 600B as shown in FIG. 2, in accordance with some embodiments. In some embodiments, the plane view of the structure 500b is similar to or the same as the plan view of the structure 500a shown in FIG. 3. The materials, configurations, structures and/or processes utilized in the following embodiment are similar to those employed in FIGS. 1A to 1E and are not repeated herein.

In some embodiments, the hybrid-bonding structure 600B is a micro-electro-mechanical system (MEMS) device structure. The hybrid-bonding structure 600B includes a first structure 500b, a second structure 300 and a third structure 400. The second structure 300 is hybrid-bonded to the first structure 500b, and the third structure 400 is hybrid-bonded to the second structure 200.

In some embodiments, the first structure 500b includes a first substrate 200, an interconnect structure 214 over the first substrate 200 and a conductive line 134 over the interconnect structure 214. In some embodiments, the first substrate 200 is a complementary metal-oxide (CMOS) semiconductor substrate. The first substrate 200 may be a semiconductor wafer such as a silicon wafer. In some embodiments, the first substrate 200 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. In some embodiments, the first substrate 200 includes an epitaxial layer. For example, the first substrate 200 has an epitaxial layer overlying a bulk semiconductor. In some embodiments, the first substrate 200 includes one or more integrated circuit structures 102 formed over the first substrate 200 in a front-end-of-line (FEOL) process.

In some embodiments, the interconnect structure 214 is formed over the first substrate 200. In some embodiments, the interconnect structure 214 is electrically connected to the integrated circuit structure 102. The interconnect structure 214 includes multiple conductive layers 212 and vias 208 formed in the dielectric layer 106. In some embodiments, the interconnect structure 214 is formed by repeatedly stacking the conductive layers 212 and the vias 208 on top of each other. The vias 208 are alternately arranged with the conductive layers 212.

The conductive layers 212 and the vias 208 may be made of a conductive material, such as copper (Cu), aluminum (Al), tungsten (W), titanium (Ti), titanium nitride (TiN), tantalum (Ta), tantalum nitride (TaN), or another applicable material. In some embodiments, the conductive layers 212 and the vias 208 are copper or copper alloy. In some embodiments, the conductive layers 212 and the vias 208 are formed by single and/or dual damascene processes. The conductive layers 212 may include multiple metal layers (namely M1, M2, M3 . . . , and Mtop) which are interconnected through the vias 208. In some embodiments, another metal line and another via are formed over and electrically connected to the conductive layers 212 and the vias 208. The conductive layers 212 and the vias 208 of the interconnect structure 214 are formed in a back-end-of-line (BEOL) process.

The dielectric layer structure 113 is formed over the interconnect structure 214. The dielectric layer structure 113 may include a single layer structure or multiple dielectric layer structure. In some embodiments, the dielectric layer structure 113 is formed of insulating material such as oxide based materials including silicon oxide ($SiO_2$), silicon oxynitride (SiON), silicon oxycarbon nitride (SiOCN) or other insulting materials.

The conductive line 134 is formed through the dielectric layer structure 113. The conductive line 134 is formed directly over the topmost conductive layer 212 of the interconnect structure 214. The conductive line 134 is electrically connected to the topmost conductive layer 212 of the interconnect structure 214. In addition, the conductive line 134 is electrically connected to the integrated circuit structure 102.

The dielectric dummy patterns 150 are formed embedded in the conductive line 134. The dielectric dummy patterns 150 are formed directly over the topmost conductive layer 212 of the interconnect structure 214. In some embodiments, the conductive line 132 serves as a bonding layer of the interconnect structure 214 of the first structure 500b. In addition, the conductive line 134 serves as a bonding layer structure of the interconnect structure 214 of the first structure 500b. In some embodiments, the dielectric dummy patterns 150 are surrounded by the conductive line 134 in a plan view shown in FIG. 3. The configuration, dimensions, shape, and arrangement of the dielectric dummy patterns 150 of the first structure 500b may be similar to, or the same as, those of the dielectric dummy patterns 150 of the structure 500a, and the details thereof are not repeated herein.

In some embodiments, the top surfaces of the dielectric dummy patterns 150 are coplanar with the top surface of the conductive line 134, and the bonding surface 154 of the first structure 500b has a planarized surface topography.

The second structure 300 is hybrid-bonded to the first structure 500b as shown in FIG. 2, in accordance with some embodiments. In some embodiments, the second structure 300 includes a second substrate 302 and bonding layers 220 and 222 formed over the second substrate 302. The second substrate 302 in a middle position of the hybrid-bonding structure 600B is configured to as a MEMS substrate. The second substrate 302 includes a moveable element 302a and a fixed element 302b surrounding the moveable element 302a.

In some embodiments, the second substrate 302 may be made of silicon (Si), silicon-based materials or other semiconductor materials, such as germanium (Ge). In some embodiments, the second substrate 302 is a semiconductor substrate, such as a silicon (Si) wafer. In some embodiments, the second substrate 302 is made of a compound semiconductor such as silicon carbide, gallium arsenic, indium arsenide, or indium phosphide. In some embodiments, the second substrate 302 is made of semiconductor material, ceramic material, polymer material, metal material, another applicable material or a combination thereof.

The bonding layer 220 is formed on a bonding surface 304 of the fixed element 302b of the second substrate 302. The bonding layer 222 is formed on a bonding surface 306 of the fixed element 302b of the second substrate 302. The bonding surface 304 is opposite to the bonding surface 306. The second substrate 302 of the second structure 300 can be hybrid-bonded to another substrate by using the bonding layer 220 and bonding layer 222 as bonding materials. The second substrate 302 is hybrid-bonded to the first substrate 200 by bonding the bonding layer 220 of the second structure 300 to the conductive line 134 of the first structure 500b as shown in FIG. 2. The first substrate 200 of the first structure 500b is separated from the second substrate 302 of the second structure 300 through the conductive line 134 of the first structure 500b and the first structure 500b. The conductive line 134 of the first structure 500b is aligned with and in contact with the bonding layer 220 of the second structure 300. In some embodiments, the topmost conductive layer 212 of the interconnect structure 214 and the bonding layer 220 of the second structure 300 encapsulate the dielectric dummy patterns 150 of the first structure 500b. In some embodiments, the dielectric dummy patterns 150 of the first structure 500b is in contact with the bonding layer 220 of the second structure 300.

The bonding layer 220 and bonding layer 222 are made of conductive material, such as metal material. In some embodiments, the bonding layer 220 is made of germanium (Ge), aluminum (Al), copper (Cu), titanium (Ti), tantalum (Ta), silver (Ag), gold (Au), nickel (Ni), indium (In), tin (Sn), or a combination thereof. The bonding layer 220 is formed by a chemical vapor deposition (CVD) process, a physical vapor deposition (PVD) process, a plating process, or another applicable process.

The third structure 400 is hybrid-bonded to the second structure 300 as shown in FIG. 2, in accordance with some embodiments. In some embodiments, the third structure 400 is flipped upside down and bonded to the second structure 300. In some embodiments, the third structure 400 includes a third substrate 402 and a bonding layer 422 formed over the third substrate 402. The third substrate 402 is configured as a cap substrate. In some embodiments, the material of the third substrate 402 of the third structure 400 may be the same as the material of the second substrate 302 of the second structure 300.

The third structure 400 is hybrid-bonded to the second structure 300 by bonding the bonding layer 422 of the third structure 400 to the bonding layer 222 of the second structure 300 as shown in FIG. 2. The bonding layer 422 of the third structure 400 is aligned with and in contact with the bonding layer 220 of the second structure 300. Some materials and processes used to form the bonding layer 422 of the third structure 400 may be similar to, or the same as, those used to form bonding layer 220 and bonding layer 222 of the second structure 300 and are not repeated herein.

FIGS. 4A-4M are plane views showing the arrangement of the dielectric dummy patterns 150a-150k embedded in the conductive line 134 of structures 500c-500n and a structure 500p, in accordance with some embodiments. The materials, configurations, structures and/or processes of portions below the conductive lines 134 of the structure 500c-500n and 500p may be similar to, or the same as, those of structure 500a and the first structure 500b, and the details thereof are not repeated herein. The dielectric dummy patterns embedded in a single conductive line 134 are separated from each other. The dielectric dummy patterns 150a-150k shown in FIGS. 4A-4M are merely examples and are not intended to be limiting the shapes and the arrangements of the dielectric dummy patterns of the present disclosure.

Figure 4A:
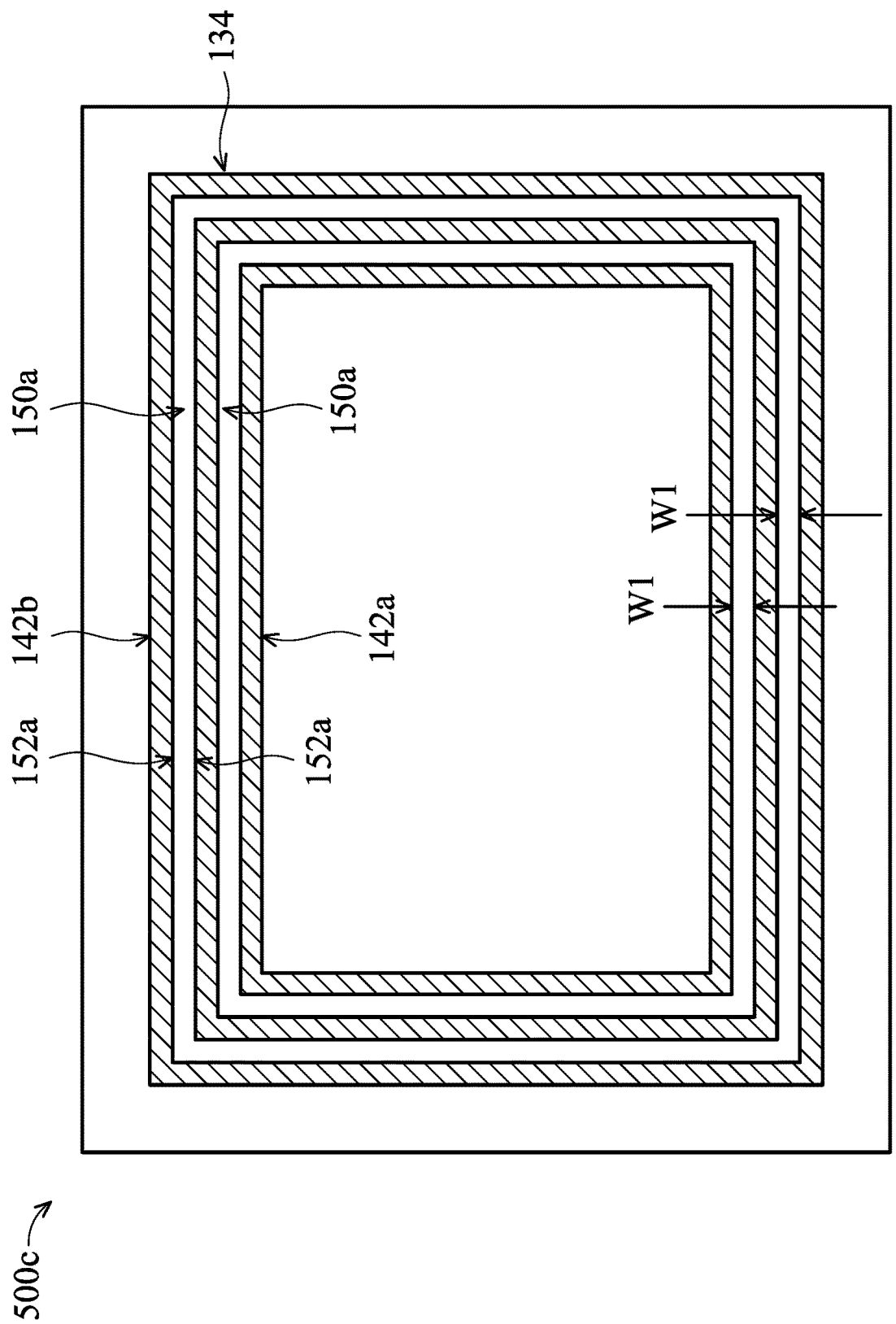
Figure 4B:
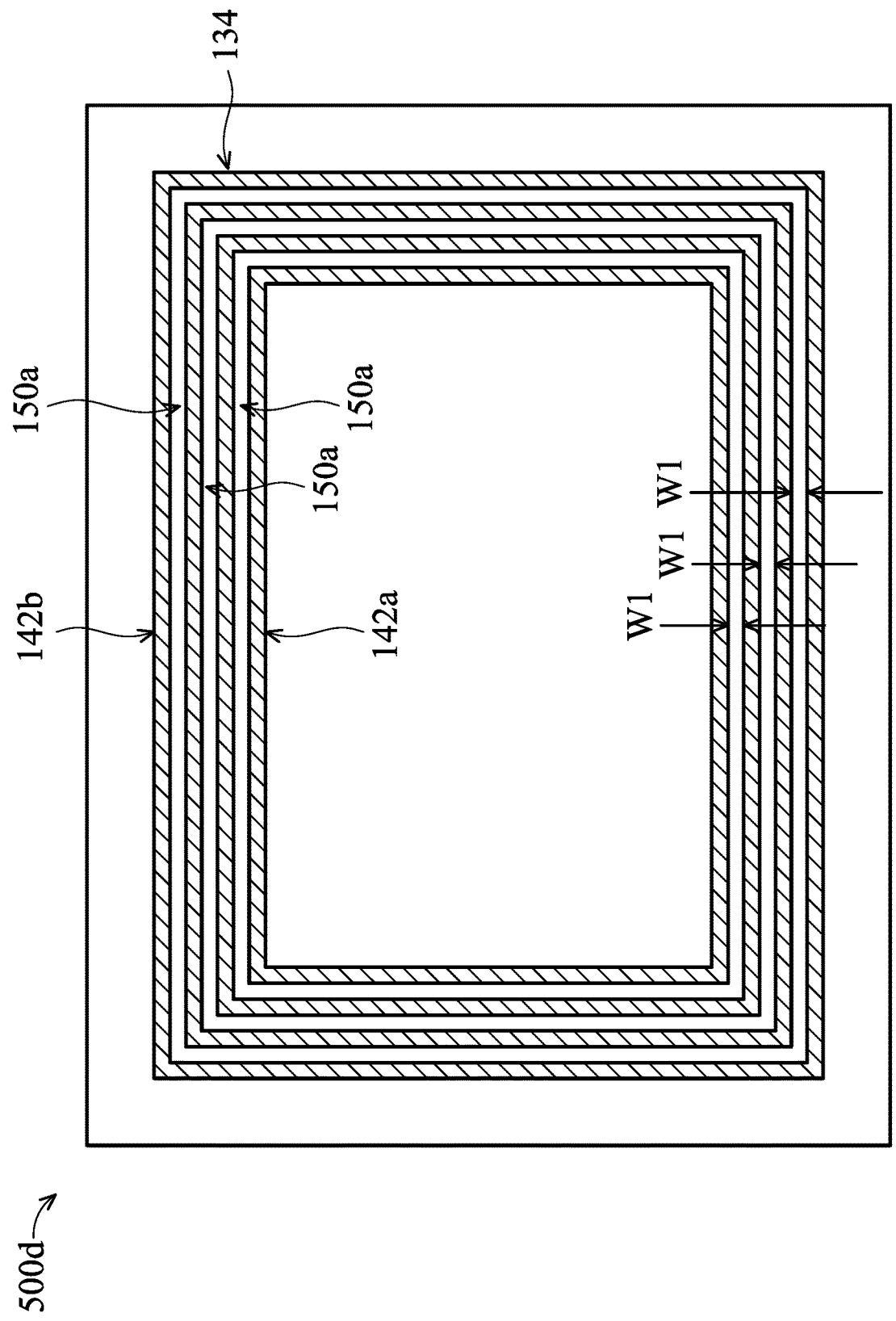

As shown in FIG. 4A and FIG. 4B, in some embodiments, each of the dielectric dummy patterns 150a embedded in the conductive line 134 of the structure 500c or the structure 500d is formed extending along the extending direction of the conductive line 134. The dielectric dummy patterns 150a are parallel to each other and form continuous concentric rings. The inner boundary 142a and the outer boundary 142b of the conductive line 134 is parallel to a boundary 152a of each of the dielectric dummy patterns 150a. Each of the dielectric dummy patterns 150a has a length that is equal to the total length of the conductive line 134. In addition, each of the dielectric dummy patterns 150a has a single width W1 that is less than the width Wb of the conductive line 134 shown in FIG. 3.

Figure 4C:
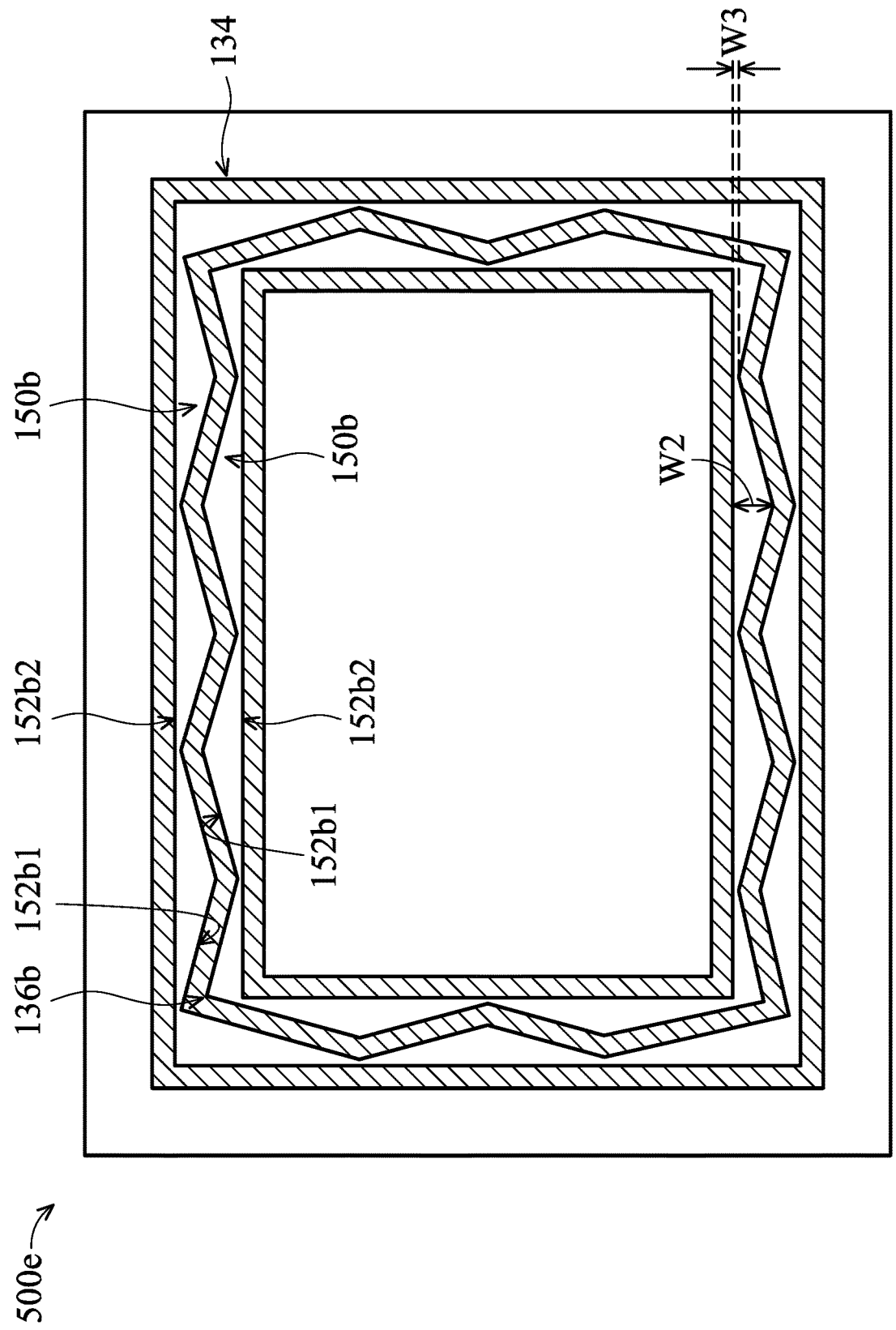

As shown in FIG. 4C, in some embodiments, each of the dielectric dummy patterns 150b embedded in the conductive line 134 of the structure 500e is formed extending along the extending direction of the conductive line 134. One of the differences between the dielectric dummy patterns 150a and the dielectric dummy patterns 150b is that the dielectric dummy patterns 150b have a first width W2 and a second width W3 that is different from the first width W2. In some embodiments, the opposite boundaries 152b1 and 152b2 of each of the dielectric dummy patterns 150b are not parallel to each other. In addition, boundaries 152b1 of the dielectric dummy patterns 150b that are close to each other are parallel to each other. In some embodiments, a portion 136b of the top surface 136 has a zigzag shape.

Figure 4D:
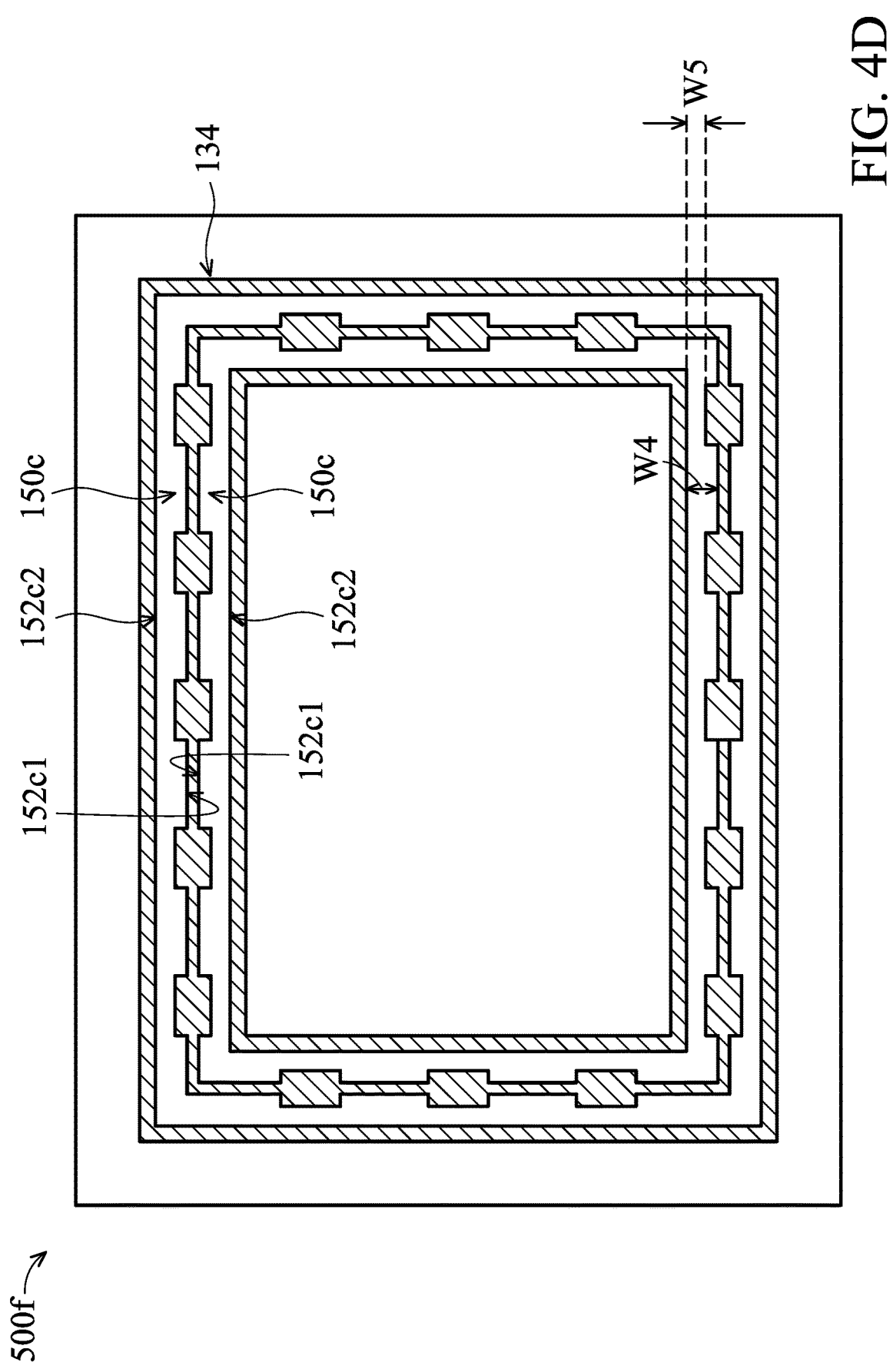
Figure 4E:
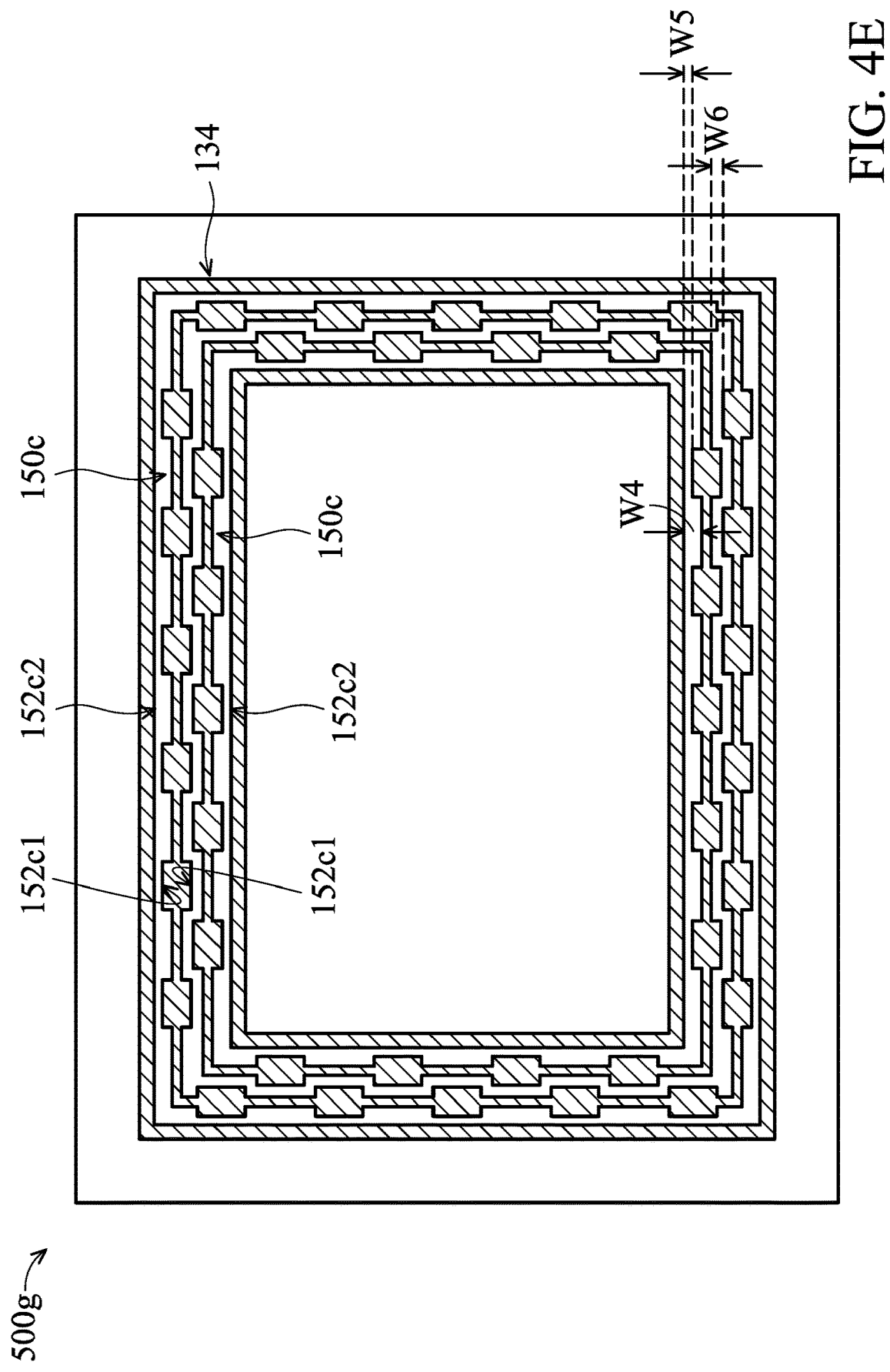

As shown in FIG. 4D and FIG. 4E, in some embodiments, each of the dielectric dummy patterns 150c embedded in the conductive line 134 of the structure 500f or the structure 500g is formed extending along the extending direction of the conductive line 134. The dielectric dummy patterns 150c have a first width W4 and a second width W5 that is different from the first width W2. In some embodiments, the boundaries 152c2 of the dielectric dummy patterns 150c are parallel to each other. In addition, boundaries 152c1 of the dielectric dummy patterns 150c close to each other are parallel to each other. As shown in FIG. 4E, a dielectric dummy pattern 150c1 between the dielectric dummy patterns 150c has a square-wave shape with a fixed width W6.

Figure 4F:
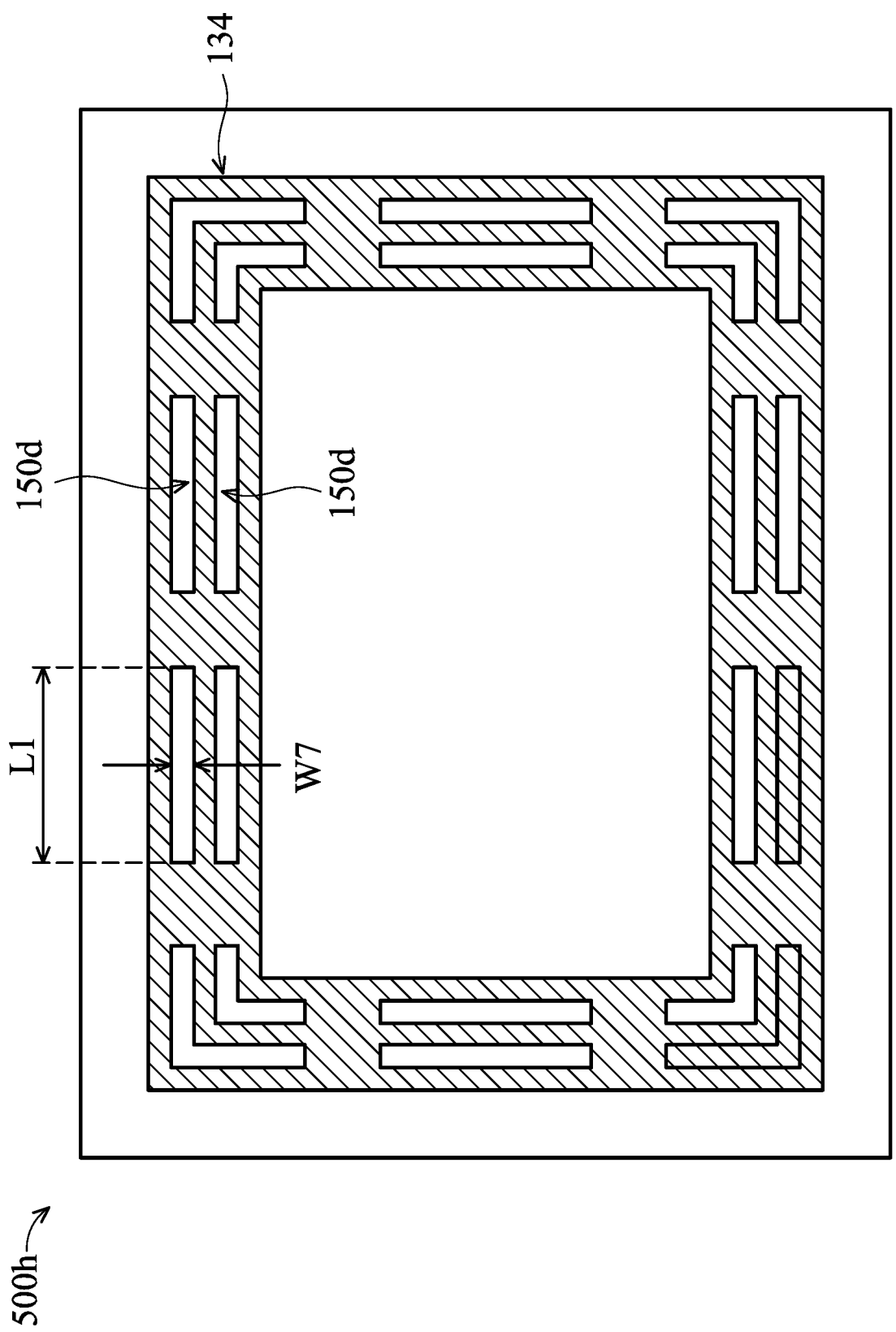

As shown in FIG. 4F, in some embodiments, dielectric dummy patterns 150d embedded in the conductive line 134 of the structure 500h are rectangular and are parallel to each other. Each of the dielectric dummy patterns 150d has a length L1 and a width W4. In some embodiments, the length L1 of each of the dielectric dummy patterns 150d is less than the total length of the conductive line 134. In some embodiments, the width W4 of each of the dielectric dummy patterns 150d is less than a width Wb of the conductive line 134 shown in FIG. 3. The length direction of the dielectric dummy patterns 150d is substantially along the extending direction of the conductive line 134. In some embodiments, the dielectric dummy patterns 150d are arranged as a two-row array.

As shown in FIG. 4F, in some embodiments, dielectric dummy patterns 150e of the structure 500i are triangular. In some embodiments, the boundaries 152e2 of the dielectric dummy patterns 150e are parallel to each other. In addition, the boundaries 152e1 of the dielectric dummy patterns 150e that are close to each other are parallel to each other.

Figure 4H:
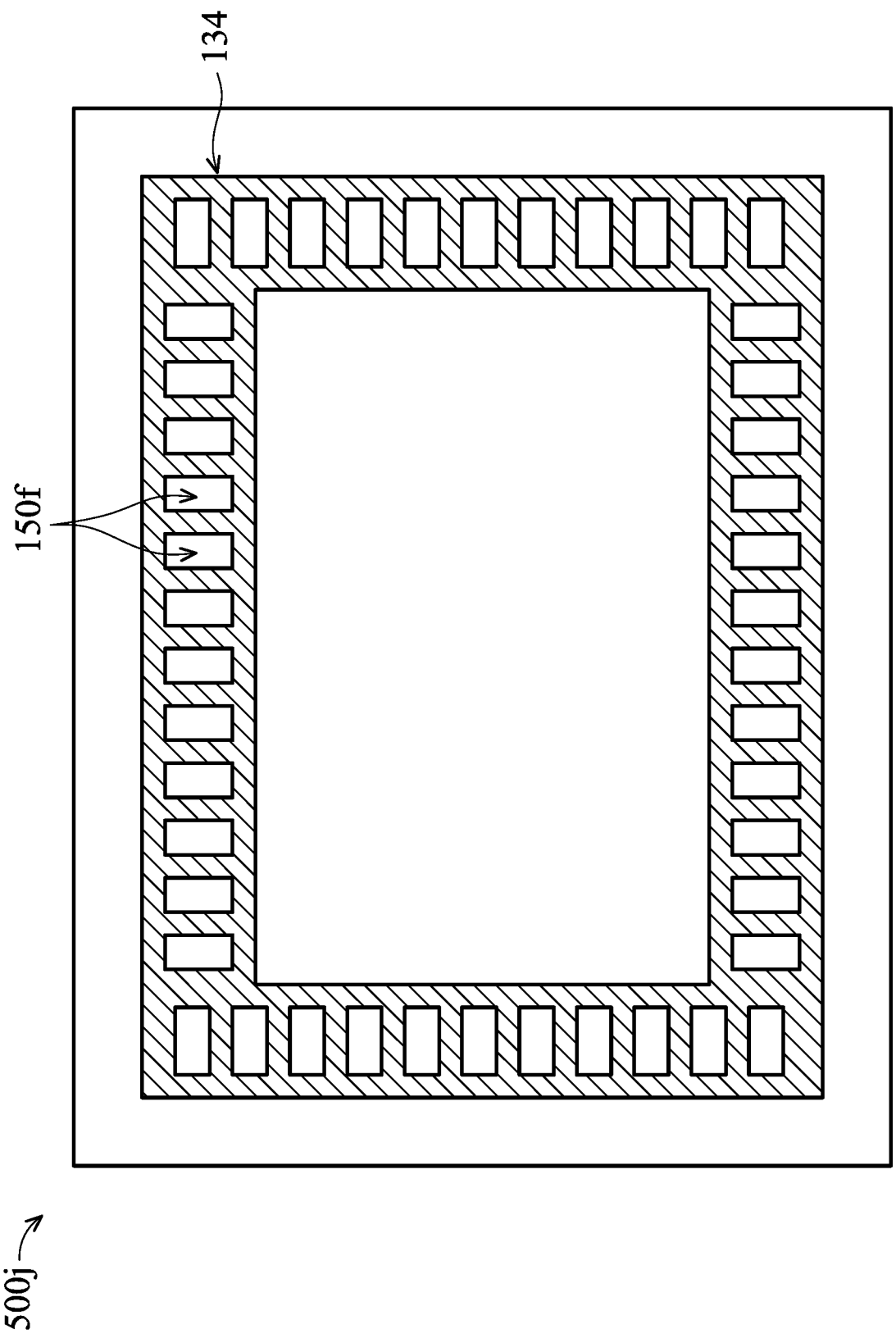

As shown in FIG. 4H, in some embodiments, dielectric dummy patterns 150f embedded in the conductive line 134 of the structure 500j are rectangular and are parallel to each other. The dielectric dummy patterns 150f are separated from each other and are periodically arranged with a fixed pitch.

Figure 4I:
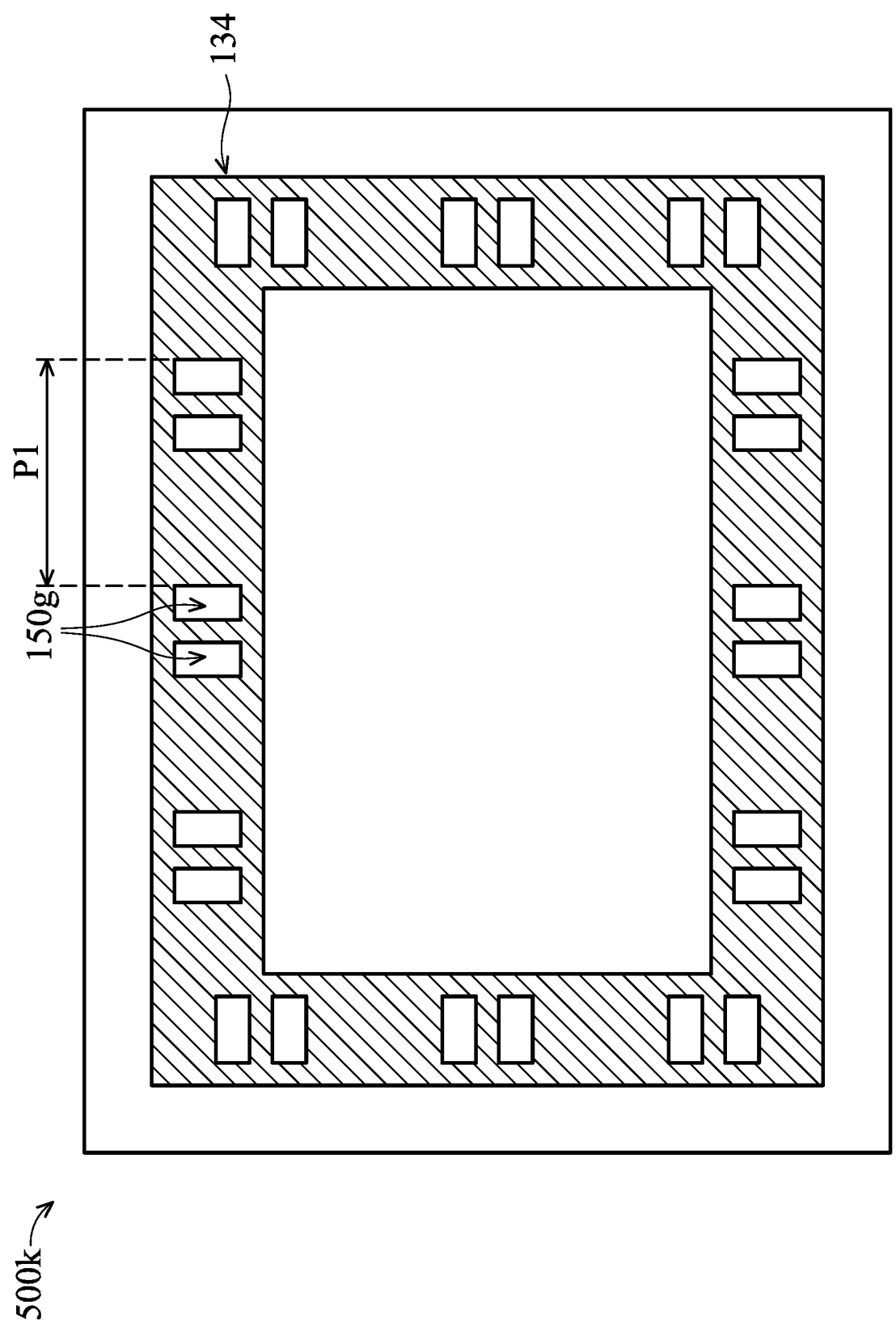

As shown in FIG. 4I, in some embodiments, the shape of the dielectric dummy patterns 150g of the structure 500k is similar to the shape of the dielectric dummy patterns 150f of the structure 500j. In some embodiments, the two dielectric dummy patterns 150g close to each other are arranged in a group. The dielectric dummy patterns 150g are arranged in multiple groups. The groups of the dielectric dummy patterns 150g are periodically arranged with a fixed pitch P1.

Figure 4J:
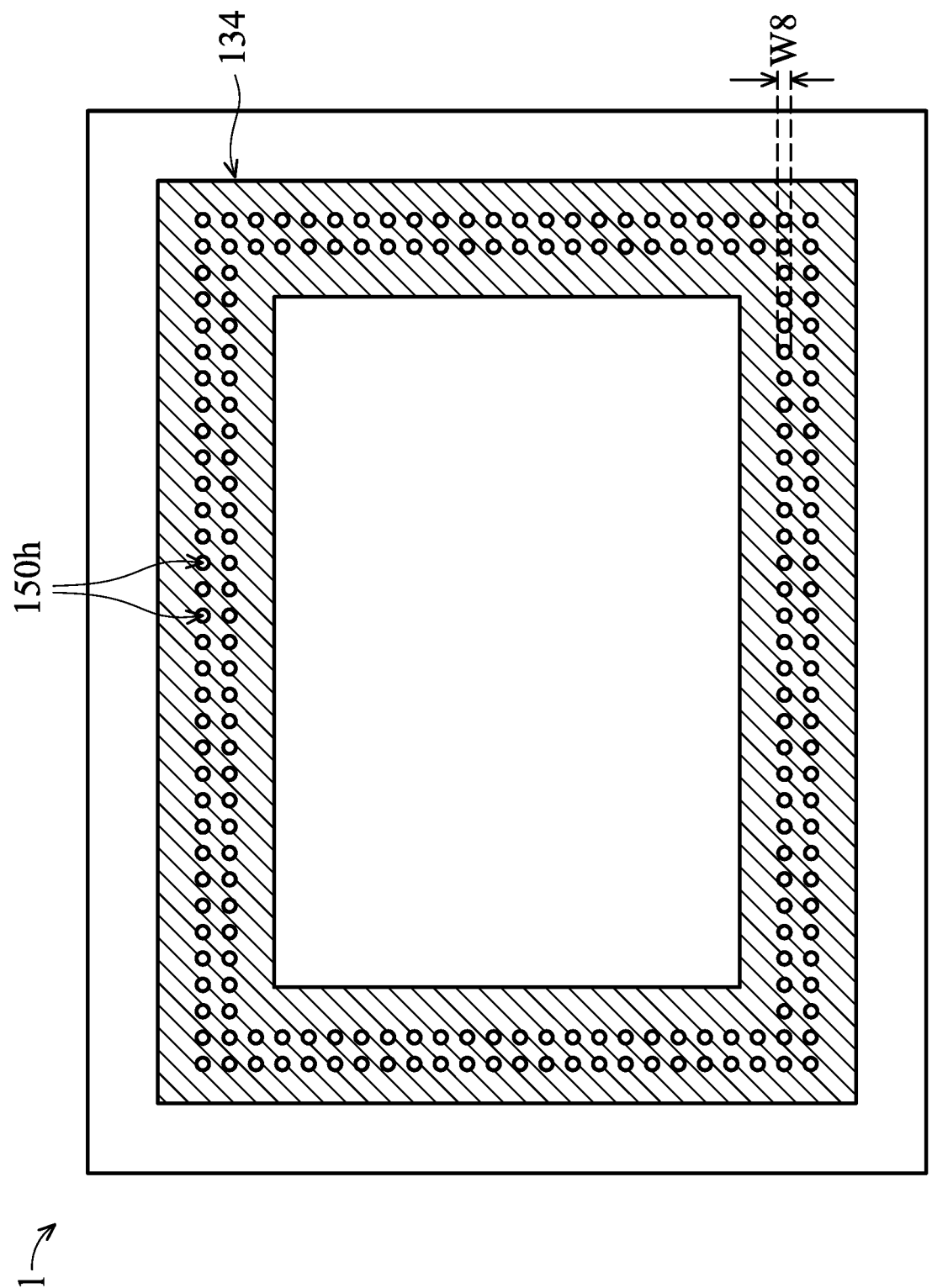

As shown in FIG. 4J, in some embodiments, dielectric dummy patterns 150h embedded in the conductive line 134 of the structure 500l are circular. The dielectric dummy patterns 150h have a diameter W8 that is less than the width of the dielectric dummy patterns 150h shown in FIG. 3. The dielectric dummy patterns 150h are periodically arranged as a two-row array.

Figure 4K:
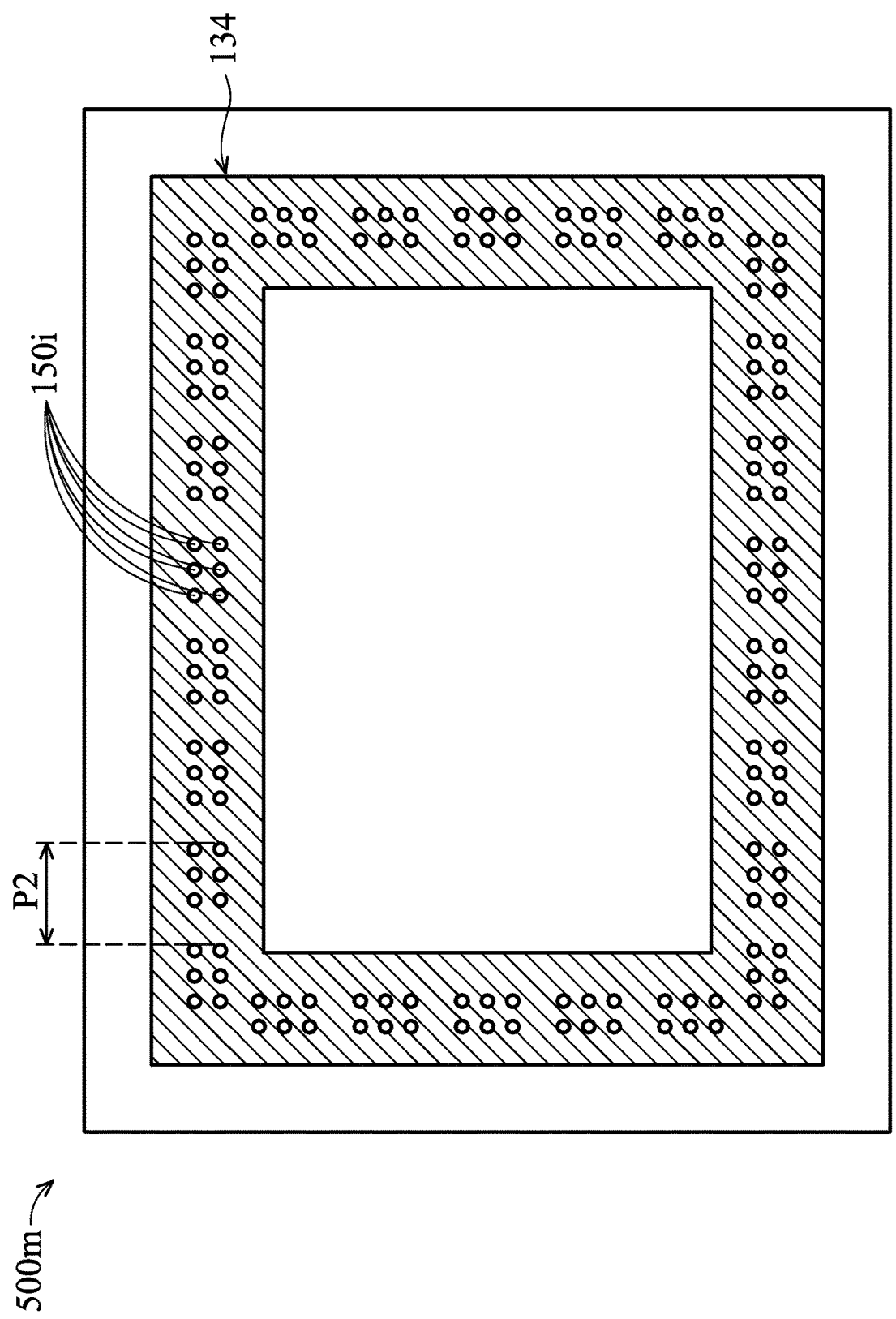

As shown in FIG. 4K, in some embodiments, the shape of dielectric dummy patterns 150i of the structure 500m is similar to the shape of the dielectric dummy patterns 150h of the structure 500l. In some embodiments, the six dielectric dummy patterns 150i close to each other are arranged in a group. The dielectric dummy patterns 150i are arranged in multiple groups. The groups of the dielectric dummy patterns 150i are periodically arranged with a fixed pitch P2.

Figure 4L:
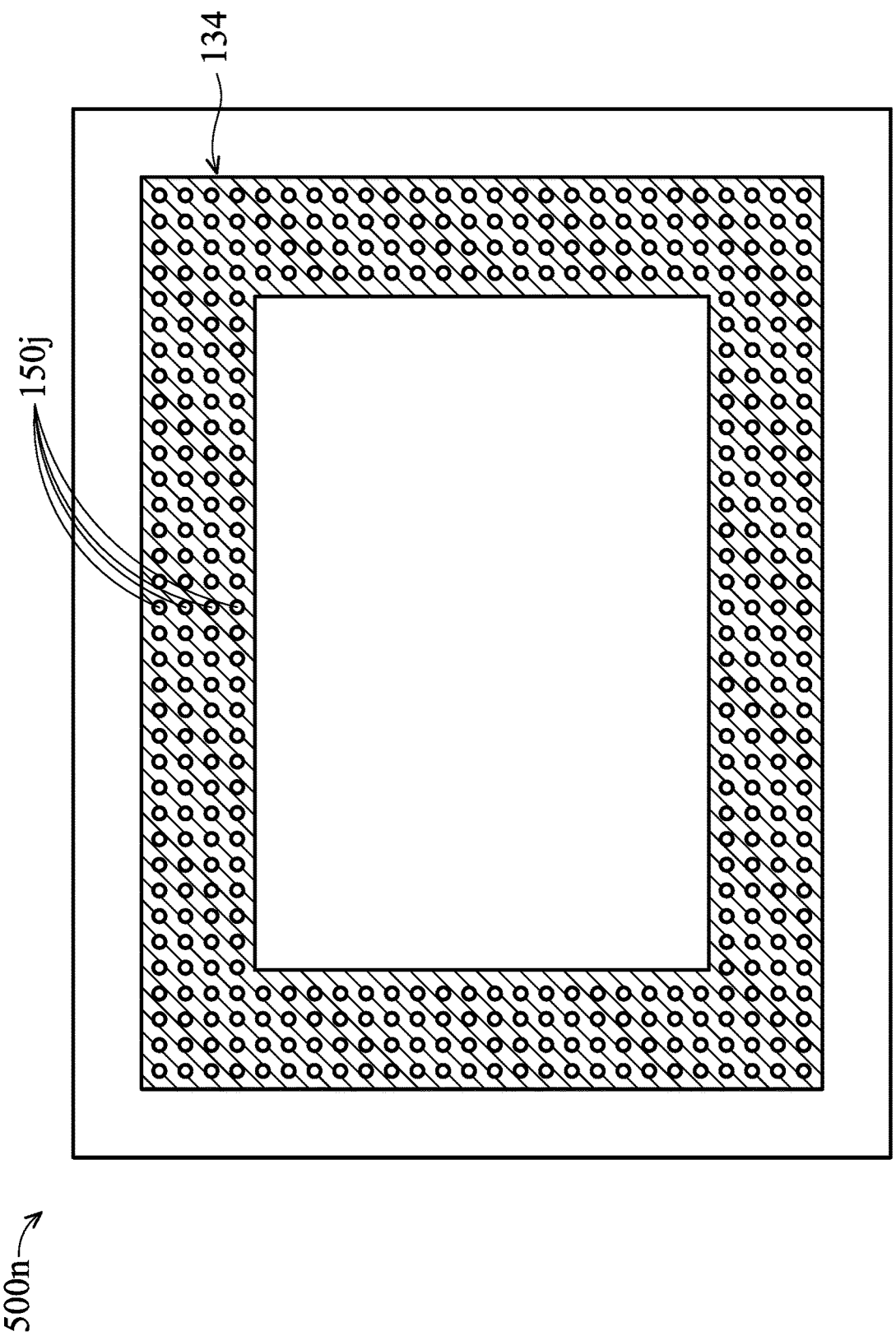

As shown in FIG. 4L, in some embodiments, the shape of dielectric dummy patterns 150j of the structure 500n is similar to the shape of the dielectric dummy patterns 150h of the structure 500l. In some embodiments, the dielectric dummy patterns 150j are arranged as a four-row array.

Figure 4M:
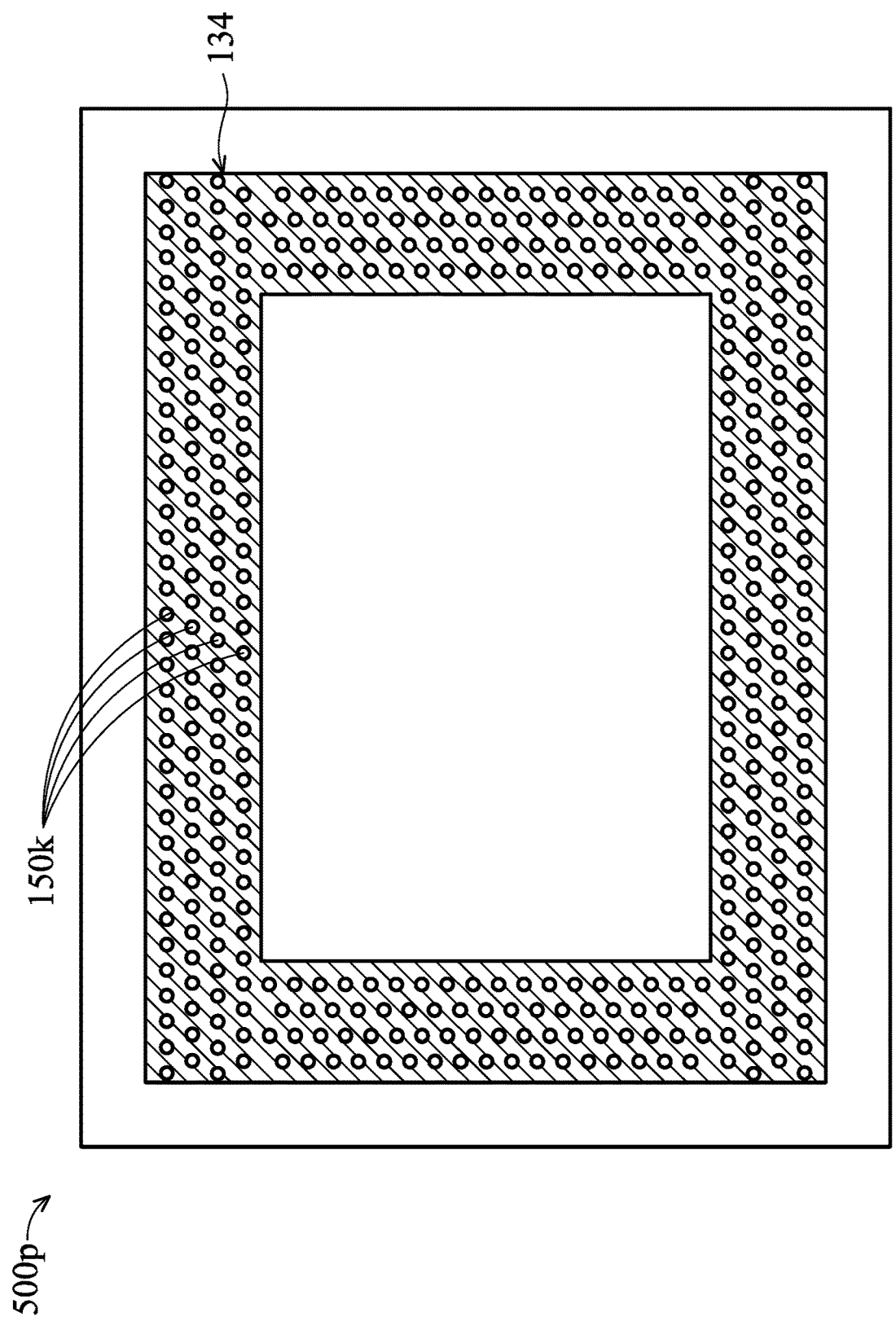

As shown in FIG. 4M, in some embodiments, the shape of dielectric dummy patterns 150k of the structure 500p is similar to the shape of the dielectric dummy patterns 150h of the structure 500l. In some embodiments, the dielectric dummy patterns 150k are arranged as a four-row array.

Embodiments for a hybrid-bonding structure (e.g. the hybrid-bonding structures 600A-600B) and a method for forming the same are provided. The hybrid-bonding structure includes a first semiconductor substrate (e.g. the substrate 100 of the structure 500a of the hybrid-bonding structure 600A, the substrate 200 of the first structure 500b of the hybrid-bonding structure 600B and the substrates 100 or 200 of the structure 500c-500n and 500p). The hybrid-bonding structure further includes a first conductive line (e.g. the conductive line 132 and the conductive line 134) and a first dielectric dummy pattern (e.g. the dielectric dummy patterns 150 and 150a-150k) over the first semiconductor substrate. A surface 136 of the first conductive line is configured to hybrid-bond with a second conductive line (e.g. the conductive line 132 of the structure 500a' of the hybrid-bonding structure 600A or the bonding layer 220 of the second structure 300 of the hybrid-bonding structure 600B) over a second semiconductor substrate (e.g. the substrate 100 of the structure 500a' of the hybrid-bonding structure 600A or the second substrate 302 of the hybrid-bonding structure 600B). The first dielectric dummy pattern is embedded in the first conductive line. The dielectric dummy patterns 150 embedded in the conductive line help to reduce the area of the top surface 136 of the conductive line 132. The dielectric dummy patterns 150 can improve the surface topography of the bonding surface 154 of the conductive line 132 after performing the planarization process 131 of the conductive line 132. When the first conductive line of the first structure is hybrid-bonded to the second conductive line of a second structure (e.g. the structure 500a' of the hybrid-bonding structure 600A or the second structure 300 of the hybrid-bonding structure 600B), the dielectric dummy patterns 150 may contribute to the bond strength between the first conductive line of the first structure and the second conductive line of the second structure. The bonding surface 154 of the conductive line 132 having a planarized surface topography can improve the bonding wave propagation during the hybrid-bonding process. The delamination problem and the conductive line opening problem that occurs between the first conductive line of the first structure and the second conductive line of the second structure are avoided. The dielectric dummy patterns can be embedded in long and wide conductive lines, such as the bonding layer of the seal ring structure or the bonding layer in 3DICs and MEMS applications.

Embodiments for a hybrid-bonding structure and a method for forming the same are provided. The hybrid-bonding structure includes a first semiconductor substrate. The hybrid-bonding structure further includes a first conductive line and a first dielectric dummy pattern over the first semiconductor substrate. A surface of the first conductive line is configured to hybrid-bond with a second conductive line over a second semiconductor substrate. The first dielectric dummy pattern is embedded in the first conductive line. The dielectric dummy patterns embedded in the conductive line help to improve the surface topography of the bonding surface of the conductive line after performing the planarization process of the conductive line. The dielectric dummy patterns may contribute to the bond strength of the hybrid-bonding structure. The dielectric dummy patterns can be embedded in the bonding layer of the seal ring structure or the bonding layer in 3DICs and MEMS applications.

In some embodiments, a hybrid-bonding structure is provided. The hybrid-bonding structure includes a first semiconductor substrate, a first conductive line and a first dielectric dummy pattern. The first conductive line is formed over the first semiconductor substrate. A surface of the first conductive line is configured to hybrid-bond with a second conductive line over a second semiconductor substrate. The first dielectric dummy pattern is formed over the first semiconductor substrate and embedded in the first conductive line.

In some embodiments, a hybrid-bonding structure is provided. The hybrid-bonding structure includes a first structure a second structure hybrid-bonded to the first structure. The first structure includes a first conductive line. The first structure also includes a first dielectric dummy pattern embedded in the first conductive line. The second structure includes a second conductive line hybrid-bonded to the first conductive line.

In some embodiments, a method for forming a hybrid-bonding structure is provided. The hybrid-bonding structure includes a first semiconductor substrate, a first conductive line and a first dielectric dummy pattern. The first conductive line is formed over the first semiconductor substrate. A surface of the first conductive line is configured to hybrid-bond with a second conductive line over a second semiconductor substrate. The first dielectric dummy pattern is formed over the first semiconductor substrate and embedded in the first conductive line. The method includes forming a first dielectric layer over the first semiconductor substrate. The first semiconductor substrate includes a conductive structure. The method also includes partially removing the first dielectric layer to form the first dielectric dummy pattern and an opening through the first dielectric layer. The first dielectric dummy pattern is surrounded by the opening. The method further includes forming the first conductive line in the opening. The first conductive line is in contact with the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A hybrid-bonding structure, comprising:
   a first semiconductor substrate;
   a first conductive line over the first semiconductor substrate; and
   a first dielectric dummy pattern over the first semiconductor substrate and embedded in the first conductive line;
   a second dielectric dummy pattern formed next to the first dielectric dummy pattern in the first conductive line; and
   a third dielectric dummy pattern formed next to the second dielectric dummy pattern in the first conductive line,
   wherein the second dielectric dummy pattern is located between the first dielectric dummy pattern and the third dummy pattern, and a maximum distance between the first dielectric dummy pattern and the second dielectric dummy pattern is greater than a maximum distance between the second dielectric dummy pattern and the third dielectric dummy pattern,
   wherein the first dielectric dummy pattern, the second dielectric dummy pattern, and the third dielectric dummy pattern are aligned in a straight line in a first direction, and no dielectric material is formed between the first dielectric dummy pattern and the second dielectric dummy pattern and between the second dielectric dummy pattern and the third dielectric dummy pattern along the first direction.

2. The hybrid-bonding structure as claimed in claim 1, further comprising:
   a seal ring structure over the first semiconductor substrate, the seal ring structure comprising:
      a plurality of conductive layers; and
      a plurality of vias alternately arranged with the plurality of conductive layers, wherein the first conductive line is in contact with a topmost conductive layer of the plurality of the conductive layer of the seal ring structure.

3. The hybrid-bonding structure as claimed in claim 1, wherein a boundary of the first conductive line is parallel to a boundary of the first dielectric dummy pattern.

4. The hybrid-bonding structure as claimed in claim 1, wherein the first dielectric dummy pattern has a circular-shape, a polygonal-shape, or a ring-shape from a plane view.

5. The hybrid-bonding structure as claimed in claim 1, wherein the second dielectric dummy pattern is separated from the first dielectric dummy pattern, wherein a second side of the second dielectric dummy pattern is parallel to a first side of the first dielectric dummy pattern.

6. The hybrid-bonding structure as claimed in claim 5, wherein the first dielectric dummy pattern, the second dielectric dummy pattern and the third dielectric dummy pattern are separated from each other.

7. The hybrid-bonding structure as claimed in claim 1, further comprising:
   a second conductive line bonded to the first conductive line;
   a fourth dielectric dummy pattern embedded in the second conductive line; and
   a fifth dielectric dummy pattern embedded in the second conductive line and separated from the fourth dielectric dummy pattern by the second conductive line,
   wherein the fourth dielectric dummy pattern is in direct contact with the first dielectric dummy pattern, and the second conductive line is in direct contact with the first conductive line.

8. A hybrid-bonding structure, comprising:
   a first structure, the first structure comprising:
      a first conductive line, wherein the first conductive line comprises a copper-containing material layer and a conductive material surrounding by the copper-containing material layer; and
      a first dielectric dummy pattern, a second dielectric dummy pattern and a third dielectric dummy pattern embedded in the first conductive line and separated from the conductive material by the copper-containing material layer, wherein the first dielectric dummy pattern, the second dielectric dummy pattern and the third dielectric dummy pattern each has a first material layer and a second material layer over the first material layer, and the first material layer and the second material layer are made of different materials;
      wherein the second dielectric dummy pattern is located between the first dielectric dummy pattern and the third dummy pattern, and a maximum distance between the first dielectric dummy pattern and the second dielectric dummy pattern is greater than a maximum distance between the second dielectric dummy pattern and the third dielectric dummy pattern,
wherein the first dielectric dummy pattern, the second dielectric dummy pattern, and the third dielectric dummy pattern are aligned in a straight line in a first direction, and no dielectric material is formed between the first dielectric dummy pattern and the second dielectric dummy pattern and between the second dielectric dummy pattern and the third dielectric dummy pattern along the first direction; and
a second structure hybrid-bonded to the first structure, the second structure comprising:
a second conductive line bonded to the first conductive line.

9. The hybrid-bonding structure as claimed in claim 8, wherein the first conductive line of the first structure is in contact with the second conductive line of the second structure.

10. The hybrid-bonding structure as claimed in claim 8, wherein the first structure comprises:
a first substrate; and
a seal ring structure over the first substrate, the seal ring structure comprising:
a plurality of conductive layers; and
a plurality of vias alternately arranged with the plurality of conductive layers, wherein the first conductive line is in contact with a topmost conductive layer of the plurality of the conductive layers of the seal ring structure.

11. The hybrid-bonding structure as claimed in claim 8, wherein the first structure comprises:
a first substrate; and
an integrated circuit structure between the first conductive line and the first substrate, wherein the first conductive line is electrically connected to the integrated circuit structure.

12. The hybrid-bonding structure as claimed in claim 11, wherein the second structure comprises:
a second substrate, wherein the second conductive line is formed on the second substrate, wherein the second substrate is separated from the first substrate through the first conductive line of the first structure and the second conductive line of the second structure.

13. The hybrid-bonding structure as claimed in claim 8, wherein a boundary of the first conductive line is parallel to a boundary of the first dielectric dummy pattern.

14. The hybrid-bonding structure as claimed in claim 8, further comprising:
a second dielectric dummy pattern embedded in the first conductive line and separated from the first dielectric dummy pattern by the first conductive line; and
a third dielectric dummy pattern embedded in the first conductive line and separated from the first dielectric dummy pattern and the second dielectric dummy pattern by the first conductive line,
wherein the first dielectric dummy pattern, the second dielectric dummy pattern, and the third dielectric dummy pattern are aligned in a first direction, and a first width of the first dielectric dummy pattern measured along the first direction is smaller than a second width of the first dielectric dummy pattern measure along a second direction perpendicular to the first direction.

15. The hybrid-bonding structure as claimed in claim 14, further comprising:
a fourth dielectric dummy pattern embedded in the second conductive line; and
a fifth dielectric dummy pattern embedded in the second conductive line and separated from the fourth dielectric dummy pattern by the second conductive line,
wherein the fourth dielectric dummy pattern bonds to the first dielectric dummy pattern, and the fifth dielectric dummy pattern bonds to the second dielectric dummy pattern.

16. A hybrid-bonding structure, comprising:
a first structure comprising:
a first conductive line arranged as a ring having an inner boundary and an outer boundary; and
a first dielectric dummy pattern positioned between the inner boundary and the outer boundary of the first conductive line;
a second dielectric dummy pattern positioned between the inner boundary and the outer boundary of the first conductive line;
a third dielectric dummy pattern positioned between the inner boundary and the outer boundary of the first conductive line,
wherein the second dielectric dummy pattern is located between the first dielectric dummy pattern and the third dummy pattern, and a maximum distance between the first dielectric dummy pattern and the second dielectric dummy pattern is greater than a maximum distance between the second dielectric dummy pattern and the third dielectric dummy pattern,
wherein the first dielectric dummy pattern, the second dielectric dummy pattern, and the third dielectric dummy pattern are aligned in a straight line in a first direction, and the first dielectric dummy pattern and the second dielectric dummy pattern are separated by a first portion of the first conductive line, and no dielectric material is formed between the first dielectric dummy pattern and the second dielectric dummy pattern and between the second dielectric dummy pattern and the third dielectric dummy pattern along the first direction; and
a second structure hybrid-bonded to the first structure, wherein the second structure comprises:
a second conductive line having an inner boundary and an outer boundary; and
a fourth dielectric dummy pattern positioned between the inner boundary and the outer boundary of the second conductive line,
wherein the first conductive line is in direct contact with the second conductive line and the first dielectric dummy pattern is in direct contact with the fourth dielectric dummy pattern.

17. The hybrid-bonding structure as claimed in claim 16, wherein the first structure comprises:
a first substrate; and
a first topmost conductive layer over the first substrate, wherein the first conductive line is positioned overlying and in contact with the first topmost conductive layer,
wherein the second structure comprises:
a second topmost conductive layer over the second conductive line.

18. The hybrid-bonding structure as claimed in claim 17, wherein the first conductive line, the first topmost conductive layer, the second conductive line and the second topmost conductive layer encapsulate the first dielectric dummy pattern.

19. The hybrid-bonding structure as claimed in claim 16, wherein the second dielectric dummy pattern and the third dielectric dummy pattern are separated by a second portion of the first conductive line, and the first portion of the first conductive line is wider than the second portion of the conductive line.

20. The hybrid-bonding structure as claimed in claim 16, wherein a sidewall of the first dielectric dummy pattern, a sidewall of the second dielectric dummy pattern and a sidewall of the third dielectric dummy pattern are in direct contact with a first sidewall, a second sidewall and a third sidewall of the first conductive line, respectively.

* * * * *